(12) United States Patent
Tokunaga et al.

(10) Patent No.: US 7,994,607 B2
(45) Date of Patent: Aug. 9, 2011

(54) SEMICONDUCTOR DEVICE AND MANUFACTURING METHOD THEREOF

(75) Inventors: Hajime Tokunaga, Isehara (JP); Ryota Tajima, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 436 days.

(21) Appl. No.: 12/010,795

(22) Filed: Jan. 30, 2008

(65) Prior Publication Data
US 2008/0224140 A1   Sep. 18, 2008

(30) Foreign Application Priority Data
Feb. 2, 2007   (JP) ................................ 2007-024434

(51) Int. Cl.
*H01L 23/525*   (2006.01)

(52) U.S. Cl. .............. 257/530; 257/3; 257/50; 257/529; 257/E23.147

(58) Field of Classification Search ................ 257/3, 50, 257/529, 530, E23.147, E23.148, E23.149, 257/E23.15
See application file for complete search history.

(56) References Cited

U.S. PATENT DOCUMENTS

| | | | |
|---|---|---|---|
| 5,206,665 A | 4/1993 | Kawade et al. | |
| 5,314,840 A | 5/1994 | Schepis et al. | |
| 5,389,475 A | 2/1995 | Yanagisawa et al. | |
| 5,485,032 A | 1/1996 | Schepis et al. | |
| 5,625,219 A | 4/1997 | Takagi | |
| 5,780,919 A | 7/1998 | Chua et al. | |
| 5,798,534 A | 8/1998 | Young | |
| 5,929,505 A | 7/1999 | Takagi et al. | |
| 6,034,882 A | 3/2000 | Johnson et al. | |
| 6,051,851 A | 4/2000 | Ohmi et al. | |
| 6,288,437 B1 | 9/2001 | Forbes et al. | |
| 6,465,282 B1 | 10/2002 | Többen et al. | |
| 6,528,815 B1 | 3/2003 | Brown et al. | |
| 6,750,530 B1 | 6/2004 | Klaasen et al. | |
| 6,828,685 B2 | 12/2004 | Stasiak | |
| 6,844,609 B2 | 1/2005 | Motsiff et al. | |
| 6,962,844 B2 | 11/2005 | Stasiak | |
| 6,979,880 B2 | 12/2005 | Bhattacharyya et al. | |
| 7,034,380 B2 | 4/2006 | Andideh | |
| 7,145,533 B2 * | 12/2006 | Imamura | 345/81 |
| 7,442,997 B2 * | 10/2008 | Zhang | 257/390 |
| 2003/0156449 A1 | 8/2003 | Ooishi | |
| 2003/0183699 A1 | 10/2003 | Masui | |

(Continued)

FOREIGN PATENT DOCUMENTS
EP   0 603 105   6/1994
(Continued)

*Primary Examiner* — Jerome Jackson, Jr.
*Assistant Examiner* — Yu Chen
(74) *Attorney, Agent, or Firm* — Eric J. Robinson; Robinson Intellectual Property Law Office, P.C.

(57) ABSTRACT

It is an object of the present invention to provide a semiconductor device mounted with a memory which can be driven in the ranges of a current value and a voltage value which can be generated from a wireless signal. It is another object to provide a write-once read-many memory into which data can be written anytime after manufacture of a semiconductor device. An antenna, an antifuse-type ROM, and a driver circuit are formed over a substrate having an insulating surface. A stacked layer of a silicon film and a germanium film is interposed between a pair of electrodes included in the antifuse-type ROM. The antifuse-type ROM having this stacked layer can reduce fluctuation in writing voltage.

15 Claims, 13 Drawing Sheets

U.S. PATENT DOCUMENTS

| | | |
|---|---|---|
| 2003/0230746 A1 | 12/2003 | Stasiak |
| 2004/0026690 A1 | 2/2004 | Bernds et al. |
| 2004/0027849 A1 | 2/2004 | Yang et al. |
| 2004/0129960 A1 | 7/2004 | Maruyama et al. |
| 2004/0164302 A1 | 8/2004 | Arai et al. |
| 2004/0217441 A1 | 11/2004 | Lehmann et al. |
| 2005/0006640 A1 | 1/2005 | Jackson et al. |
| 2005/0174845 A1 | 8/2005 | Koyama et al. |
| 2006/0097250 A1 | 5/2006 | Koyama et al. |
| 2006/0175648 A1 | 8/2006 | Asami |
| 2006/0220252 A1 | 10/2006 | Yukawa et al. |
| 2006/0263634 A1 | 11/2006 | Yamazaki |
| 2007/0007342 A1 | 1/2007 | Cleeves et al. |
| 2007/0258221 A1 | 11/2007 | Koyama et al. |

FOREIGN PATENT DOCUMENTS

| | | |
|---|---|---|
| EP | 0 680 087 | 11/1995 |
| EP | 1 435 653 | 7/2004 |
| JP | 56-044198 | 4/1981 |
| JP | 04-028249 | 1/1992 |
| JP | 04-373147 | 12/1992 |
| JP | 05-343633 | 12/1993 |
| JP | 06-260558 | 9/1994 |
| JP | 07-297293 A | 11/1995 |
| JP | 08-078532 | 3/1996 |
| JP | 3501416 | 3/2004 |
| JP | 2004-214281 | 7/2004 |
| JP | 2005-251183 | 9/2005 |
| JP | 2006-107470 | 4/2006 |
| JP | 2006-114875 | 4/2006 |
| JP | 2007-059880 | 3/2007 |
| WO | WO 96/07300 | 3/1996 |
| WO | WO 2004/015778 | 2/2004 |
| WO | WO 2005076359 A1 * | 8/2005 |
| WO | WO 2005/096380 | 10/2005 |
| WO | WO 2005/119779 | 12/2005 |
| WO | WO 2006/028231 | 3/2006 |

* cited by examiner

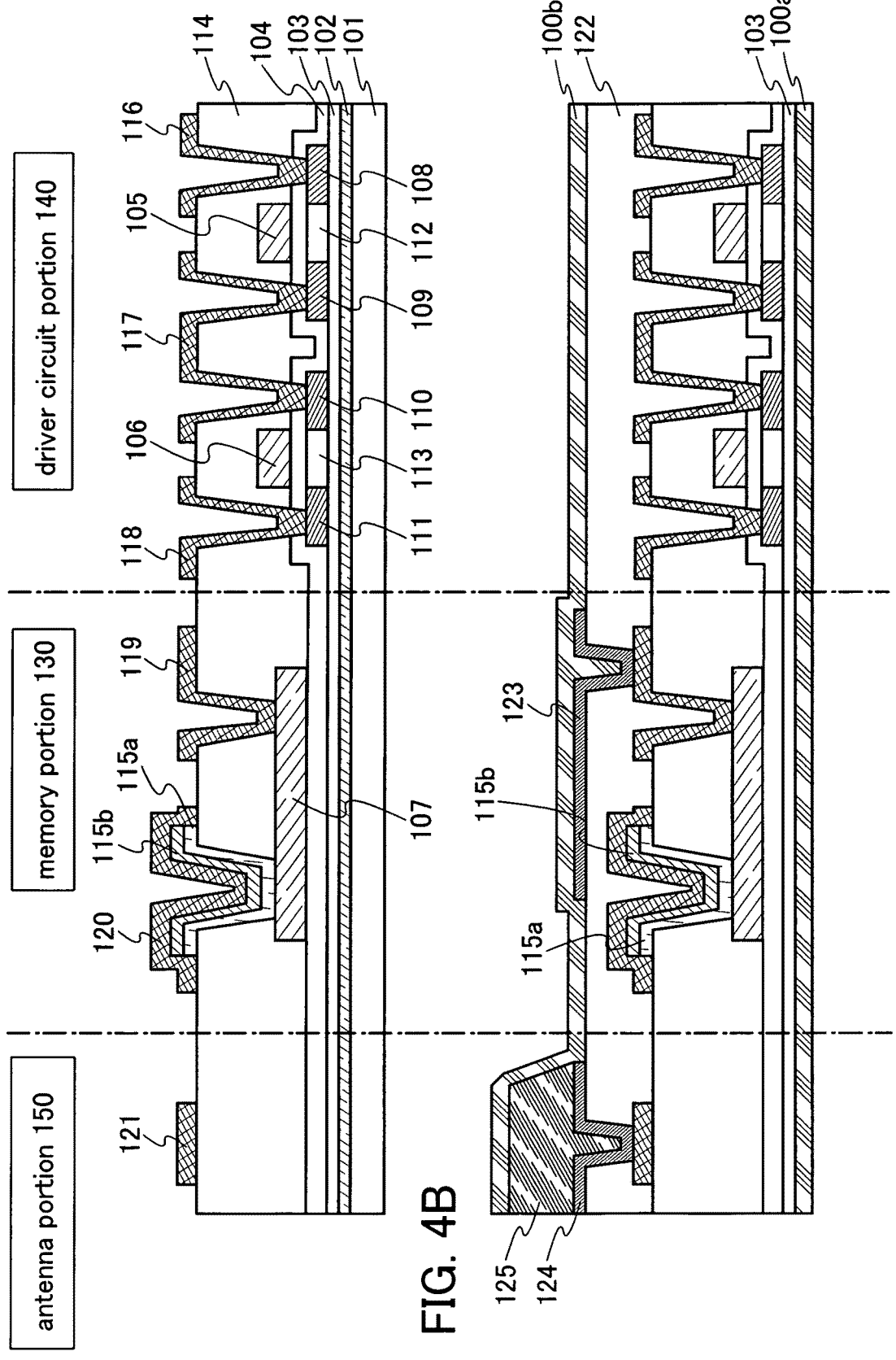

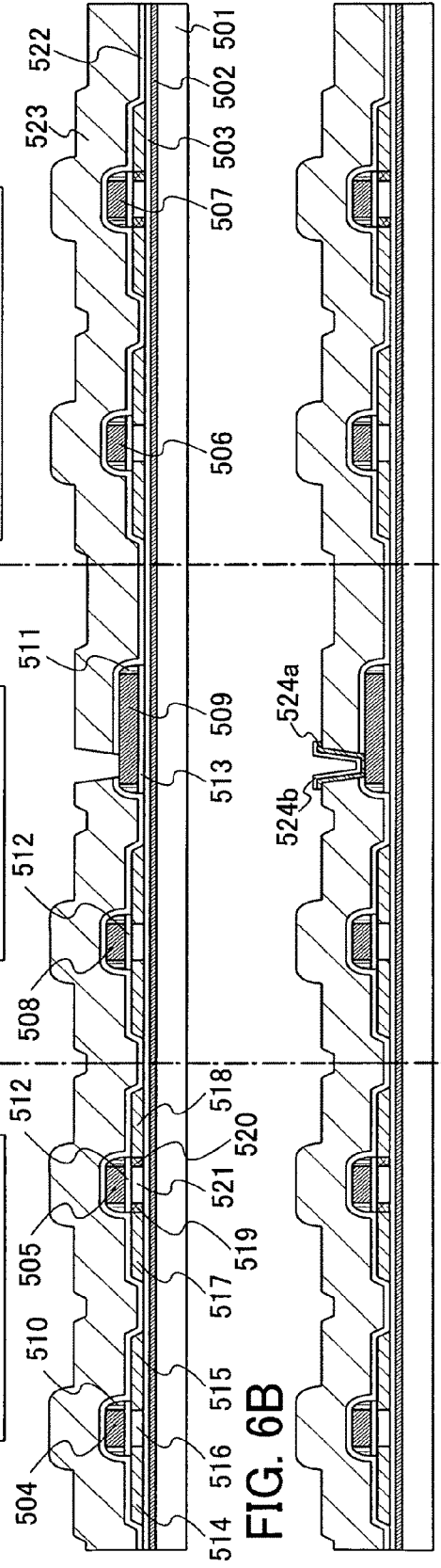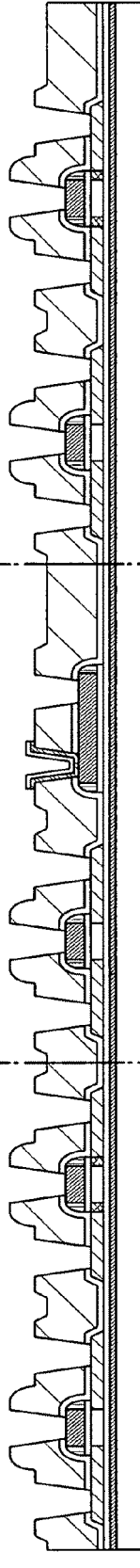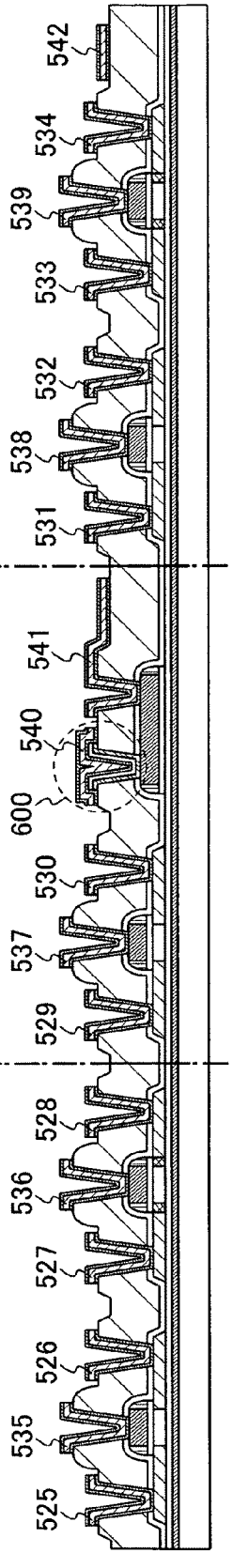

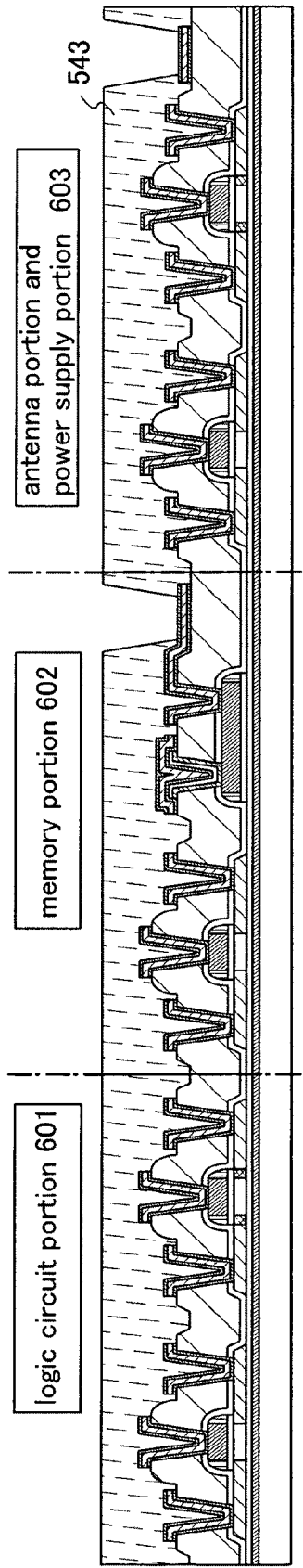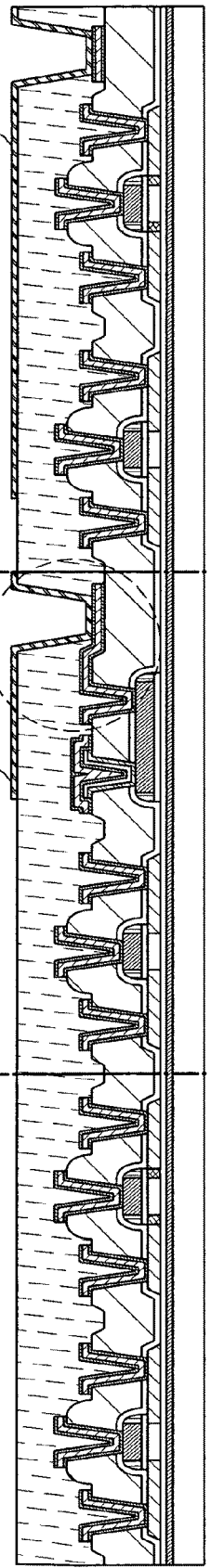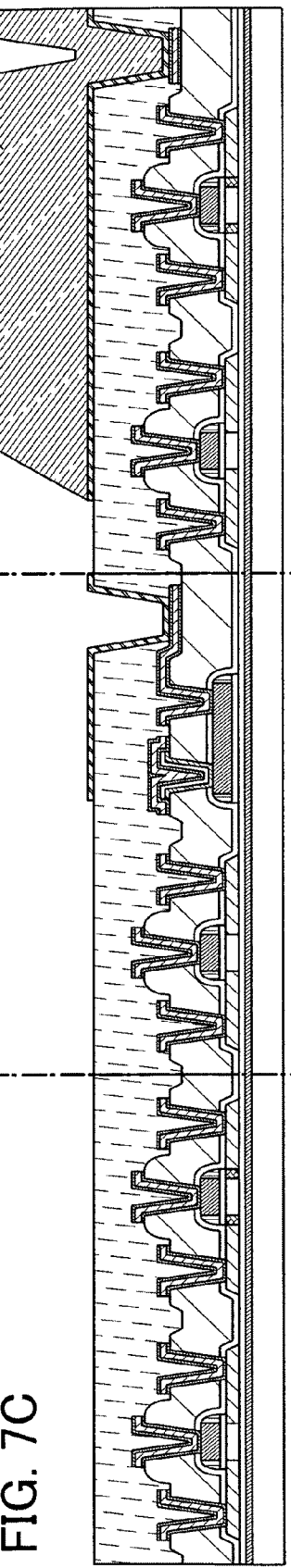

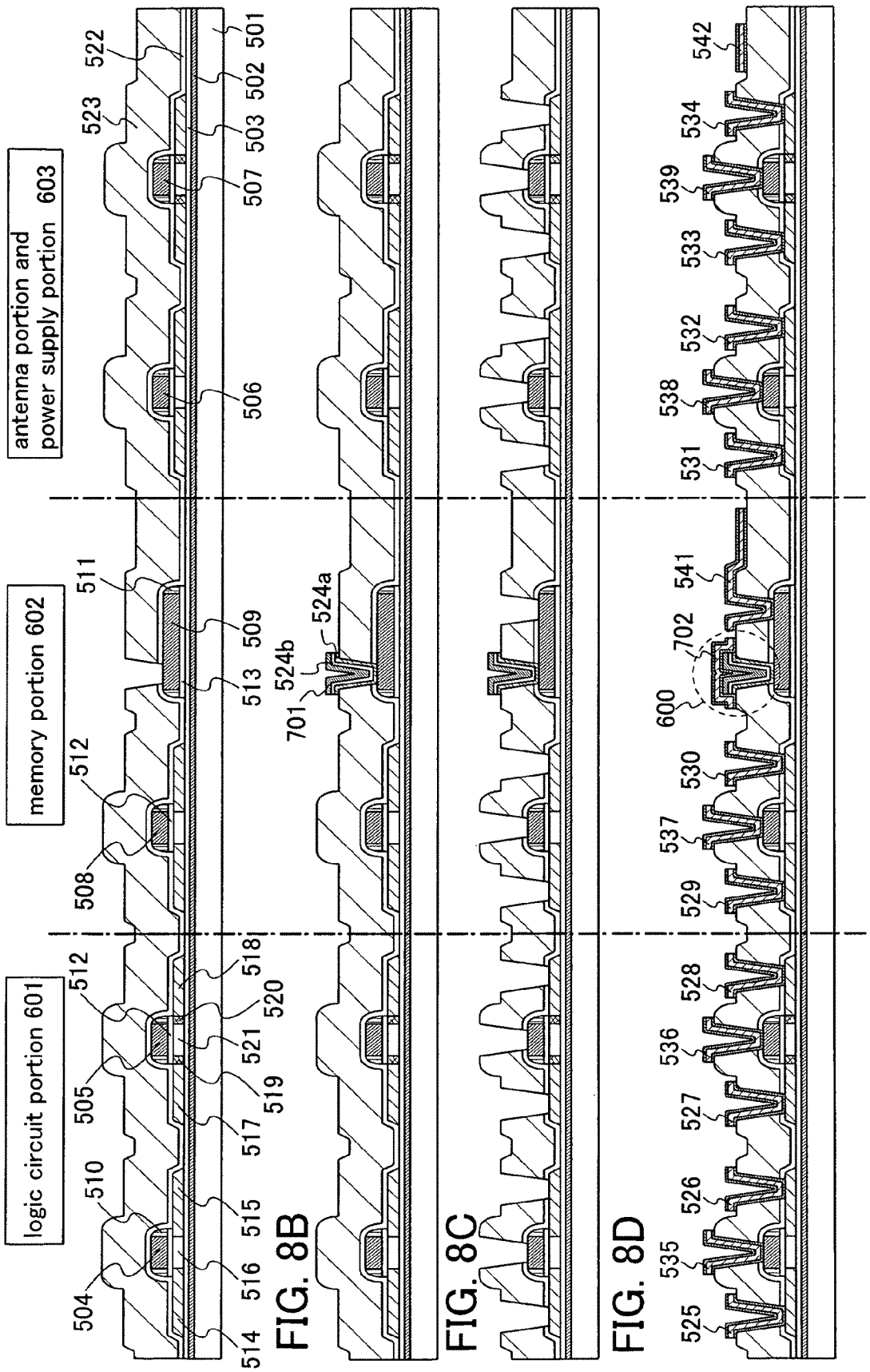

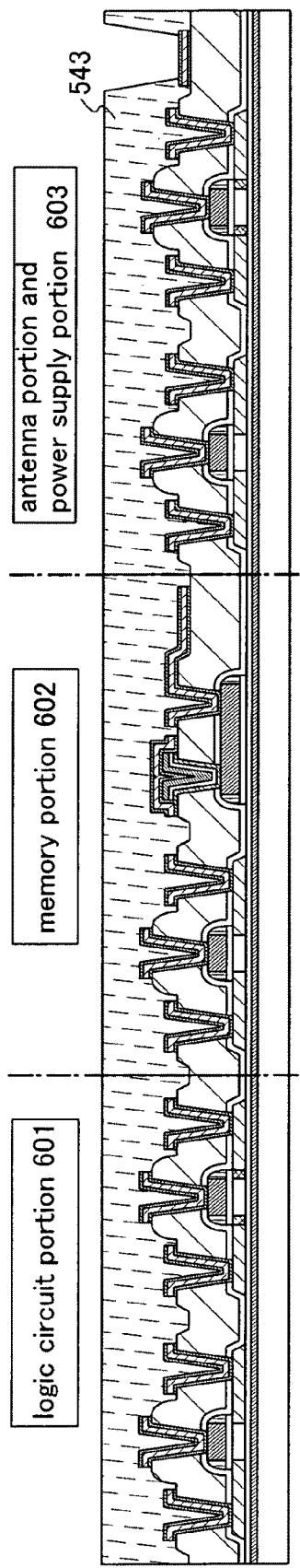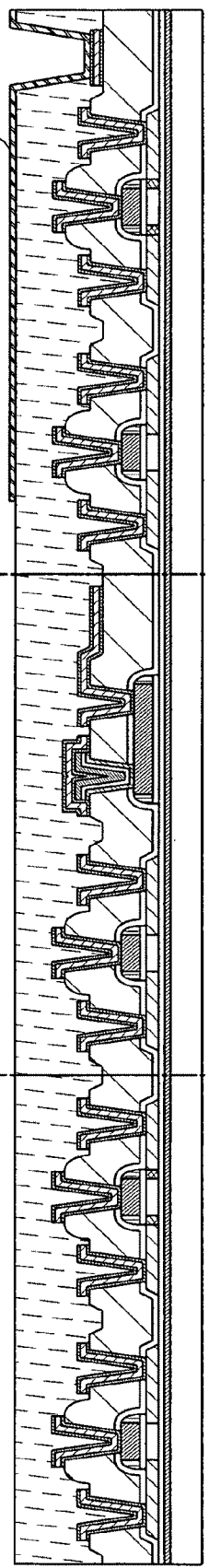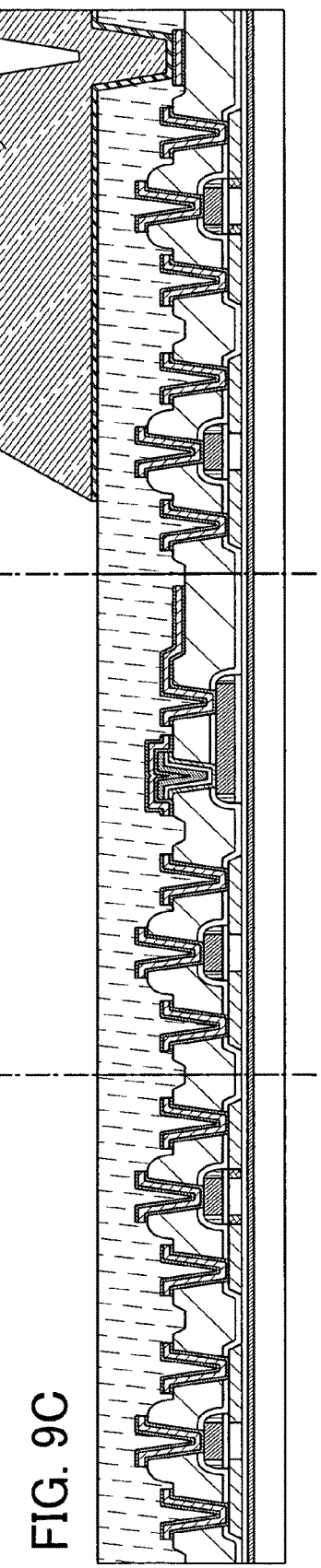
FIG. 9A / FIG. 9B / FIG. 9C — logic circuit portion 601, memory portion 602, antenna portion and power supply portion 603

PRIOR ART

SEMICONDUCTOR DEVICE AND MANUFACTURING METHOD THEREOF

BACKGROUND OF THE INVENTION

1. Field of the Invention

The present invention relates to semiconductor devices each having a circuit including a thin film transistor (hereinafter referred to as a TFT) and manufacturing methods thereof. For example, the present invention relates to electronic appliances in each of which an electro-optical device typified by a liquid crystal display panel or a light-emitting display device including an organic light-emitting element is mounted as a component.

Note that semiconductor devices in this specification refer to general devices which can function by utilization of semiconductor characteristics, and electro-optical devices, semiconductor circuits, and electronic appliances are all semiconductor devices.

2. Description of the Related Art

Various types of memories have conventionally been proposed. As typical memories, the following can be given: memories each including an electromagnetic tape or an electromagnetic disk, a RAM capable of writing and reading, a ROM only for reading (read only memory), and the like.

As conventional ROMs, the following can be given: a mask ROM which stores data with a mask in an IC manufacturing process, a fuse-type ROM which stores data by melting down a fuse element with current after manufacture of an IC chip, an antifuse-type ROM which stores data by short-circuiting an insulator with current after manufacture of an IC chip, and the like.

Since a mask ROM stores data with a mask in an IC manufacturing process, a mask corresponding to data to be written has to be prepared; thus, the manufacturing cost has been increased. In addition, a fuse-type ROM could cause malfunction due to dust generated when a fuse element is melted down.

Further, an antifuse-type ROM is more advantageous than other ROMs in that a mask corresponding to data to be written at the time of manufacturing is not necessary and dust is not generated when data is written to the memory. As an example of an antifuse-type ROM formed on a silicon substrate, technology described in Patent Document 1: Japanese Published Patent Application No. H7-297293 is given.

FIG. 13 shows a cross-sectional view of an antifuse-type ROM disclosed in Patent Document 1. In FIG. 13, a silicon substrate 50 over which an nMOS transistor is formed, an amorphous silicon film 53, a tungsten film 54, a tungsten film 54', and an Al—Si—Cu wiring 55 are formed. Although reference numerals 51 and 52 are not clearly identified in Patent Document 1, the reference numeral 51 is probably an $n^+$ drain region and the reference numeral 52 is probably a $SiO_2$ film formed by a CVD method. Patent Document 1 is characterized in that the tungsten film 54', the amorphous silicon film 53, and the tungsten film 54 which form a stacked film are continuously formed with a multi-chamber system without exposure to the air.

In addition, an antifuse-type ROM using a main body of germanium by being in contact with a main body containing aluminum is disclosed in Patent Document 2: Japanese Published Patent Application No. H6-260558.

Moreover, an antifuse-type ROM in which an amorphous silicon film containing germanium is interposed between wirings is disclosed in Patent Document 3: Japanese Published Patent Application No. H5-343633.

In recent years, a semiconductor device with a wireless communication function, specifically a wireless chip, has been expected to have a large market, thereby having attracted attention. Such a wireless chip may be referred to as an ID tag, an IC tag, an IC chip, a radio frequency (RF) tag, a wireless tag, an electronic tag, and a radio frequency identification (RFID) in accordance with usage.

A wireless chip includes an interface, memory, a control portion, and the like. As the memory, a RAM capable of writing and reading and a ROM only for reading are used, and they are separately used in accordance with purposes. Specifically, a memory region is assigned for each specified application, and an access right is managed for each application and each directory. In order to manage the access right, the wireless chip has a verification unit which compares and verifies a private code of application and a control unit which gives users the access right regarding the application to which the private code is identical, according to the comparison and verification by the verification unit. Such a wireless chip is formed using a silicon wafer, and integrated circuits such as a memory circuit and an arithmetic circuit are integrated on a semiconductor substrate.

When a card to which such a wireless chip is mounted (a so-called IC card) is compared with a magnetic card, the IC card has advantages of having a large memory capacity, an arithmetic function, high authentication accuracy, and great difficulty in falsification. Therefore, the IC card is suitable for management of personal information. A ROM only for reading is commonly used as a memory mounted to an IC card so that falsification is impossible.

SUMMARY OF THE INVENTION

Conventional wireless chips are each manufactured using an expensive silicon wafer similarly to a microprocessor or a semiconductor memory. Therefore, there has been an inevitable limit to reduce the unit cost of the wireless chips. In particular, a memory region which is needed for the wireless chip occupies a large area in a silicon chip, and it has been necessary to reduce the area occupied by the memory region without change of memory capacity in reducing the unit cost of the chip. Further, reduction in cost can be expected by miniaturization of the silicon chip; however, mounting cost of the silicon chip is increased, when miniaturization of the silicon chip proceeds. In order to distribute the chips to the market, it is extremely important to reduce the unit cost of the chips, which is one of priorities in commodity production.

In the wireless chip, in the case where a terminal of the silicon chip and an antenna are connected to each other with an ACF or the like, a ratio of heat expansion when a temperature becomes high or a ratio of heat shrink when a temperature becomes low is different depending on a component; thus, high thermal stress is generated between different components. Since the wireless chip is attached to an article, there is a concern that a connection portion between the terminal of the silicon chip and the antenna may be disconnected due to thermal stress in view of being exposed under various environments.

Further, the conventional wireless chip is not suitable for being attached to a curved surface of an article even if the wireless chip is a smaller piece because it uses silicon for a structure. In the case where a silicon chip has been mounted on a base formed of a flexible material, there has been a concern that a connection portion between the silicon chip and an antenna of the base might be destroyed when the base has been bent along the curved surface of the article. Although there has been a method of grinding and polishing a silicon wafer itself to thin the silicon wafer, the number of steps is increased due to the step of thinning the silicon wafer, which has been in contradiction to reduction in manufacturing cost. Even if a wireless chip is thinned, in the case of an IC tag which is attached to an article to be used, disfigurement is caused because a protrusion occurs on a surface of the base when the wireless chip is attached to a thin base (for example, a strip of film or a slip of paper). Further, since a protrusion occurs on the surface of the base, in the case of performing printing to a base such as a slip of paper, high-definition printing becomes difficult. Moreover, there has been a concern that a location where a silicon chip, which is an object to be falsified, exists might be emphasized. Furthermore, there has been a concern that, when a silicon chip is thinned, mechanical strength of the silicon chip might be decreased and the silicon chip might be broken when a base is bent.

In the case where an antifuse-type ROM is mounted on a wireless chip, two process sequences are considered. One is a process sequence in which data is written after manufacture of a silicon chip in which a ROM is formed, and then the silicon chip is mounted with an antenna provided for a substrate, so that a wireless chip is completed. When such a process sequence is employed, a manufacturing device for writing data during manufacturing process of the wireless chip is needed. Each silicon chip is minute, and a manufacturing device for supplying current for writing different data to a ROM which is formed in each silicon chip needs precision location alignment or the like, thereby being expensive. Therefore, manufacturing cost is increased due to this manufacturing device.

The other is a process sequence in which, after a silicon chip is mounted on a substrate having an antenna, a wireless signal is transmitted to the ROM formed on the silicon chip, and data is written using the wireless signal, so that a wireless chip is completed. In comparison with the former process sequence, increase in manufacturing cost can be suppressed with the utilization of a wireless signal when such a process sequence is employed.

However, in the case of employing the latter process sequence, information is written to the ROM with the utilization of current generated from the wireless signal; thus, a writing current value and a writing voltage value to the ROM are restricted.

It is an object of the present invention to provide a semiconductor device mounted with a memory which can be driven in the ranges of a current value and a voltage value which can be generated from a wireless signal. It is another object to provide write-once read-many memory to which data can be written anytime after manufacture of a semiconductor device.

It is another object to provide a wireless chip which is suitable for being attached to a curved surface of an article. Further, it is another object to reduce manufacturing cost and unit cost of a chip without increase of the number of manufacturing processes.

Since a wireless chip is required to perform data communication with a reader in a short period of time; thus, it is another object to provide a wireless chip which performs fast reading and has less malfunction. Further, it is another object to reduce power consumption of a memory by reduction of electric power for reading data of the memory and to achieve lower power consumption of a whole wireless chip.

An antifuse-type ROM includes a pair of electrodes formed of different materials and stacked layers of a silicon film and a germanium film which are interposed between the pair of electrodes. Reduction in writing voltage value can be achieved with the use of an antifuse-type ROM using the stacked layers of a silicon film and a germanium film, as compared with an antifuse-type ROM using a silicon film in a single layer.

In the antifuse-type ROM of the present invention, a material of one of the pair of electrodes which is in contact with the silicon film may be any as long as a silicide can be formed by reaction with silicon, and a single substance of titanium (Ti), tungsten (W), nickel (Ni), chromium (Cr), molybdenum (Mo), tantalum (Ta), cobalt (Co), zirconium (Zr), vanadium (V), palladium (Pd), hafnium (Hf), platinum (Pt), iron (Fe), or the like, or an alloy or a compound thereof can be used.

A melting point of germanium is 937.4 C.°, which is lower than a melting point of silicon which is 1410 C.°. Thus, writing is performed on the antifuse-type ROM; therefore, when voltage is applied between the electrodes of the antifuse-type ROM, it is considered that the germanium film reacts with the second electrode in contact with the germanium film before a silicide is generated between the silicon film and the first electrode in contact with the silicon film.

Further, in order that current which generates a silicide flows in one direction, a work function of a material contained in the first electrode is preferably higher than a work function of a material contained in the second electrode. Furthermore, it is considered that fluctuation in writing voltage can be reduced when current which generates a silicide flows in one direction.

Moreover, it is considered that the work function of a material contained in the first electrode is made higher than the work function of a material contained in the second electrode, so that much heat is generated at the interface between the silicon film and the first electrode than the interface between the germanium film and the second electrode.

It has been found that this antifuse-type ROM is formed over the same substrate as a driver circuit, preferably over an insulating substrate, so that at least one of the above-described objects is realized. In addition, according to the present invention, the antifuse-type ROM and the driver circuit are formed over the same substrate, so that reduction in noise or contact resistance can be achieved and low power consumption of a whole wireless chip can be achieved. Further preferably, an antenna, an antifuse-type ROM, and a driver circuit are formed over an insulating substrate. When the antenna, the antifuse-type ROM, and the driver circuit are formed over the same substrate, a power supply signal is formed based on a signal from an antenna which receives a wireless signal, and the power supply signal can be effectively utilized without loss.

Besides, one of the pair of electrodes included in the antifuse-type ROM is formed through the same step and of the same material as a gate electrode of a transistor included in a driver circuit, so that simplification of a process can be achieved. According to the present invention, the antifuse-type ROM and the driver circuit are formed over the same substrate, so that reduction in noise or contact resistance can be achieved and low power consumption of the whole wireless chip can be achieved. Since data communication with a reader in a short period of time is required, a TFT using a semiconductor film having a crystal structure, that is, a polysilicon film is preferably used as the transistor of the driver circuit. In order to obtain a TFT with preferable electric characteristics, a high melting-point metal is preferably used as a material of a gate electrode of the transistor. Of high melting-point metals, a tungsten film which reacts with silicon to form a silicide is a material which has a relatively high work function of 4.55 (eV); therefore, threshold voltages of both a p-channel transistor and an n-channel transistor are low and the both transistors are roughly symmetric to each other.

That is, it can be said that the tungsten film is suitable for the driver circuit including a CMOS circuit and also for one of the pair of electrodes of the antifuse-type ROM.

Furthermore, the other of the pair of electrodes included in the antifuse-type ROM is also formed through the same step and of the same material as a source electrode and a drain electrode of the transistor included in the driver circuit, so that simplification of the process can be achieved. Since the source electrode and the drain electrode of the transistor are formed over an interlayer insulating film to be in contact with the interlayer insulating film, the electrodes are preferably formed of a material which has high adhesion with the interlayer insulating film. In addition, a light metal of which specific gravity is less than or equal to 5 is used for the source electrode and the drain electrode of the transistor. Since a light metal such as aluminum or titanium has low electric resistance, it is useful as a wiring material of an integrated circuit. It is preferable to use a titanium film because adhesion with an insulating film or other metal film is improved. Moreover, a titanium film has lower material cost and electric resistance than a high melting-point metal. That is, it can be said that a titanium film is suitable for the source electrode and the drain electrode of the transistor and also for one of the pair of electrodes of the antifuse-type ROM. Note that a work function of a titanium film is 3.8 (eV).

As described above, it is useful to differentiate materials of the first electrode and the second electrode which are the pair of electrodes of the antifuse-type ROM in order to reduce manufacturing cost as much as possible.

Besides, the other of the pair of electrodes included in the antifuse-type ROM is formed through the same step and of the same material as a connection electrode for electrically connecting an antenna to the driver circuit, so that simplification of the process can be achieved. The antifuse-type ROM, the driver circuit, and the antenna are formed over the same substrate, so that reduction in noise or contact resistance can be achieved and low power consumption of the whole wireless chip can be achieved.

An amorphous silicon film, a microcrystalline silicon film, or a polycrystalline silicon film (also referred to as a polysilicon film) can be used as a silicon film which is used for the antifuse-type ROM. Further, oxygen or nitrogen may be purposely contained in the silicon film which is used for the antifuse-type ROM. The amount of contained oxygen or nitrogen is greater than or equal to the SIMS lower detection limit, preferably, greater than or equal to $1 \times 10^{15}/cm^3$ and less than $1 \times 10^{20}/cm^3$ by SIMS measurement. Oxygen or nitrogen is purposely contained, so that a difference in electric resistance between before and after writing of the antifuse-type ROM can be increased. The difference in the electric resistance between before and after writing is increased, so that a wireless chip with fewer malfunctions can be provided.

Alternatively, germanium may be added to the silicon film which is one of the stacked layers used for the antifuse-type ROM. Since germanium has lower energy for reaction with another metal element than silicon, reduction in writing voltage value of the antifuse-type ROM can be achieved.

For the germanium film which is one of the stacked layers used for the antifuse-type ROM, an amorphous germanium film, a microcrystalline germanium film, or a polycrystalline germanium film can be used. Alternatively, a germanium film containing silicon may be used. Further, both of the stacked layers may be films containing germanium and silicon. However, at least one layer contains a larger amount of silicon than germanium and the other layer contains a larger amount of germanium than silicon.

Further, stacked layers of different semiconductor material layers are provided between the pair of electrodes so as to separate functions. A first phenomenon which is caused by voltage application to one of the semiconductor material layers and a second phenomenon which is caused by voltage application to the other semiconductor material layer are made to occur separately to cause short circuit efficiently. The use of different conductive materials for the pair of electrodes is preferable because occurrence of different phenomena can be promoted. However, the pair of electrodes is not necessarily formed of different conductive materials and the same conductive materials may be used. When the pair of electrodes is formed with the same conductive materials, manufacturing cost can be reduced.

An antifuse-type ROM includes a pair of electrodes formed of the same materials and the stacked layers of a silicon film and a germanium film which are interposed between the pair of electrodes. This antifuse-type ROM is formed over the same substrate as a driver circuit, preferably over an insulating substrate, so that at least one of the above-described objects is realized.

An overall structure including a substrate of the antifuse-type ROM of the present invention greatly differs from that of the antifuse-type ROM described in Patent Document 1. In the antifuse-type ROM described in Patent Document 1, a silicon substrate that is a conductor which blocks a wireless signal is used; thus, the antifuse-type ROM is unsuitable for wireless communication. There is no description on wireless communication in Patent Document 1; however, even if an antenna is provided for the antifuse-type ROM described in Patent Document 1, radio waves can be transmitted and received only to and from a surface where the antenna is formed. Besides, noise is increased due to inductive current generated in the silicon substrate, and accordingly, there is a concern that communication sensitivity may be significantly reduced. Further, the antifuse-type ROM of the present invention greatly differs from the antifuse-type ROM described in Patent Document 1 in that the insulating substrate is used. The insulating substrate such as a glass substrate or a plastic substrate does not block a wireless signal; thus, radio waves can be transmitted and received to and from various directions other than a surface where the antenna is formed. In addition, as to the antifuse-type ROM of the present invention, inductive current is not generated in the substrate; thus, noise is not increased and preferable communication sensitivity can be realized.

Further, there is no description on germanium in Patent Document 1. Besides, there is no description on a structure in which a silicon film and a germanium film are stacked in Patent Document 1.

In the technology described in Patent Document 1, as shown in FIG. 13, the tungsten film 54, the amorphous silicon film 53, and the tungsten film 54' are continuously formed by a CVD method without exposure to the air. Therefore, steps of the antifuse-type ROM are simply added to steps of the conventional nMOS transistor, and accordingly, the total number of steps is large. Differently from the semiconductor device described in Patent Document 1, in the semiconductor device of the present invention, the gate electrode of the TFT of the driver circuit is formed through the same step as one of the electrodes of the antifuse-type ROM to reduce the number of steps. Note that Patent Document 1 is mainly characterized in that the tungsten film 54, the amorphous silicon film 53, and the tungsten film 54' are continuously formed without exposure to the air. Therefore, formation of a gate electrode of a transistor and one of electrodes of the antifuse-type ROM through the same step as in the manufacturing process of the present invention is not assumed at all. Accordingly, the manufacturing process of the semiconductor device of Patent Document 1 greatly differs from that of the present invention.

In addition, in Patent Document 2, a single substance of germanium is used, and there is no description on a structure in which a silicon film and a germanium film are stacked. In the case of a single substance of germanium, a problem of high power consumption of a memory element arises. In addition, in Patent Document 3, an amorphous silicon film in a single layer which contains germanium is used, and there is no description on a structure in which a silicon film and a germanium film are stacked.

In addition, the antifuse-type ROM of the present invention can be formed over an insulating substrate such as a glass substrate or a plastic substrate, separated from the insulating substrate, and transferred to slip of paper or strip of film. In a thus formed wireless chip using the slip of paper as a base, a protrusion is hardly generated on a surface in comparison with a wireless chip using a silicon chip. Therefore, even in the case where printing is further performed on the wireless chip using the slip of paper as a base, high-definition printing is possible. Moreover, in the conventional wireless chip, there has been a concern that a connection portion of the silicon chip and an antenna of the base may have been destroyed when the substrate has been bent in accordance with the curved surface of the article. However, in the wireless chip of the present invention, since the antenna, the antifuse-type ROM, and the driver circuit are formed over the same substrate, a flexible wireless chip can be realized.

The driver circuit of the semiconductor device of the present invention includes a writing circuit to the antifuse-type ROM, a reading circuit to the antifuse-type ROM, a voltage generation circuit such as a boosting circuit, a clock generation circuit, a timing control circuit, a sense amplifier, an output circuit, or a signal processing circuit such as a buffer. Further, the driver circuit of the semiconductor device of the present invention may have a structure in which a circuit added with another component such as a limiter circuit of power supply voltage or hardware only for processing codes is included.

The antifuse-type ROM to be mounted on the semiconductor device of the present invention may be either an active memory device or a passive memory device. In either case, formation of the driver circuit over the same substrate as the antifuse-type ROM makes it possible to realize at least one of the objects of the present invention. In the case of the active memory device, one memory element and at least one switching element are provided for one memory cell of antifuse-type ROM, and the memory cells are arranged in matrix. In the case of the passive (simple matrix) memory device, a structure is employed in which a plurality of bit lines arranged in parallel in a stripe form (strip form) and a plurality of word lines arranged in parallel in a stripe form are provided so as to be perpendicular to each other, and a material layer is interposed therebetween at each crossing portion. Accordingly, writing processing of a memory element at an intersecting point of a selected bit line (a bit line to which voltage is applied) and a selected word line is performed, or reading processing thereof is performed.

A semiconductor device mounted with a memory which can be driven in the ranges of a current value and a voltage value which can be generated from a wireless signal can be realized, and also unit cost of a chip can be reduced. Further, variation of writing voltages among a plurality of memories can be reduced.

BRIEF DESCRIPTION OF THE DRAWINGS

In the accompanying drawings:
FIGS. 4A and 4B are cross-sectional views of a process of the present invention;
FIGS. 6A to 6D are cross-sectional views showing a manufacturing process of a wireless chip;
FIGS. 7A to 7C are cross-sectional views showing a manufacturing process of a wireless chip;
FIGS. 8A to 8D are cross-sectional views showing a manufacturing process of a wireless chip;
FIGS. 9A to 9C are cross-sectional views showing a manufacturing process of a wireless chip.

DETAILED DESCRIPTION OF THE INVENTION

Figure 1A:
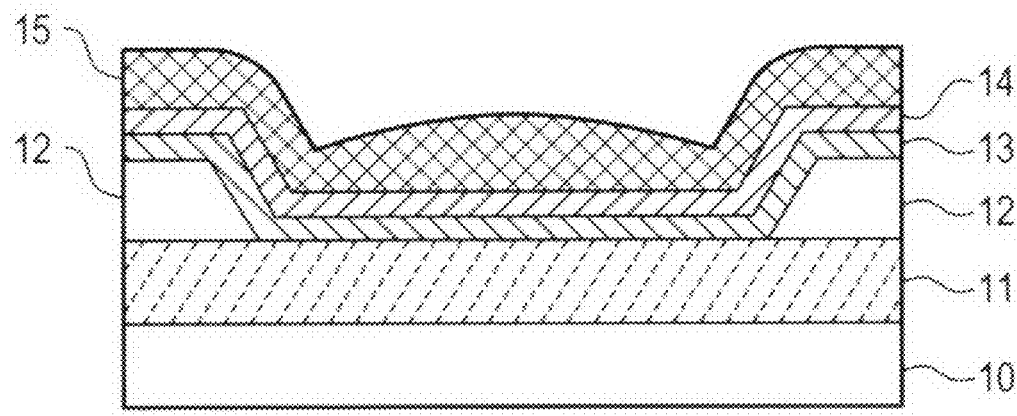
FIGS. 1A and 1B are a cross-sectional schematic view and a photograph of a cross section of an antifuse-type ROM.

Embodiment modes and embodiment modes of the present invention will be hereinafter described. However, it is easily understood by those skilled in the art that the present invention is not limited to the following description, and modes and details of the present invention can be modified in various ways without departing from the spirit and the scope of the present invention. Therefore, the present invention should not be interpreted as being limited to the description of the embodiment modes and embodiments below. Note that reference numerals denoting the same portions are used in common in different drawings in the structure of the present invention described below.

Embodiment Mode 1

FIG. 1A shows a cross-sectional schematic view of an antifuse-type ROM of the present invention.

As an example is shown in FIG. 1A, the antifuse-type ROM of the present invention has a structure in which a first electrode 11 is formed over a substrate 10 having an insulating surface, and a silicon film 13, a germanium film 14, and a second electrode 15 are sequentially stacked over the first electrode 11.

These electrodes are short-circuited by voltage application between the first electrode 11 and the second electrode 15, whereby data is written to a memory element.

As materials of the first electrode 11 and the second electrode 15, a single substance of tungsten (W), titanium (Ti), nickel (Ni), chromium (Cr), molybdenum (Mo), tantalum (Ta), cobalt (Co), zirconium (Zr), vanadium (V), palladium (Pd), hafnium (Hf), platinum (Pt), iron (Fe), or the like, or an alloy or a compound thereof is used to form a conductive film by a sputtering method, which may be processed into a desired shape.

Note that FIG. 1A shows a cross section of one memory element. However, without particular limitation thereto, a plurality of memory elements are provided to increase the amount of data to be stored. In the case where a plurality of memory elements are provided, insulators 12 to be partition walls are provided to achieve insulation between neighboring memory elements. A region in which the silicon film 13, the germanium film 14, and the second electrode 15 are sequentially stacked and the insulator 12 and the first electrode 11 are not in contact with each other corresponds to the size of a memory element. Consumption current increases as the area of this region is large; therefore, this region is preferably as small as possible.

Figure 1B:
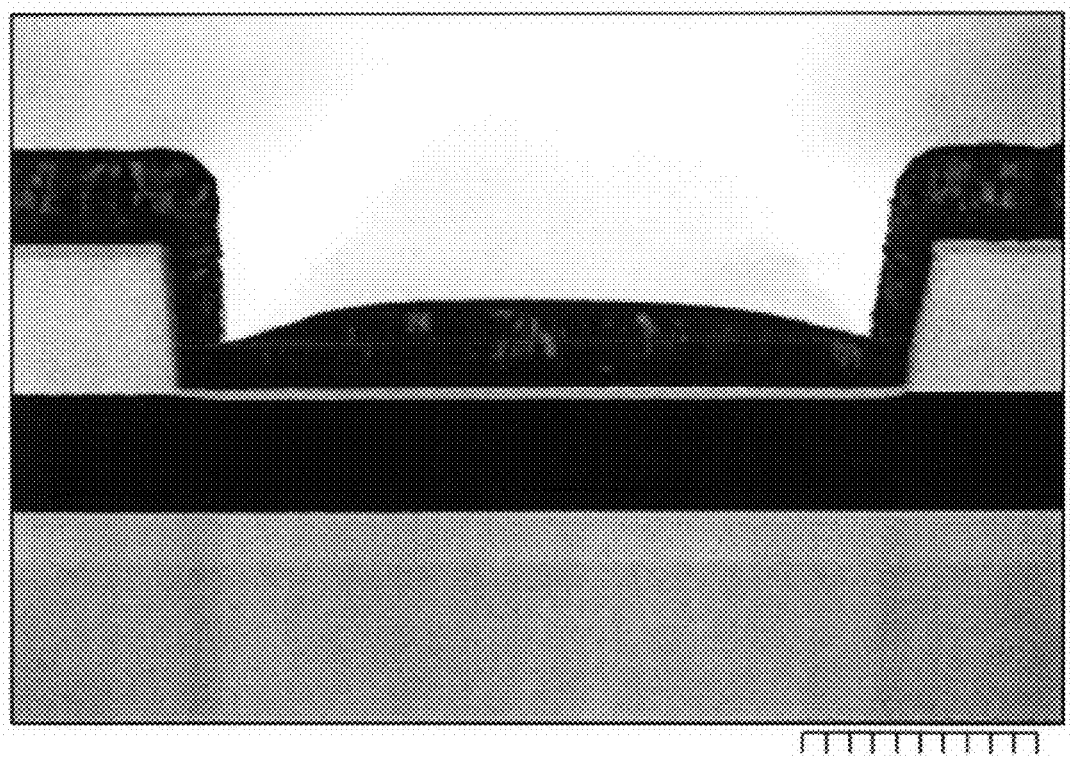

FIG. 1B shows a cross-sectional photograph of a state after the formation of the antifuse-type ROM over a glass substrate. A 50 nm thick amorphous silicon film which is deposited by a plasma CVD method is used for the silicon film of the photographed antifuse-type ROM. The amorphous silicon film is deposited under the following conditions: a substrate temperature is set at 250 C.°; a distance between electrodes of a parallel plate (a TS distance), 25 mm; a pressure in a chamber, 66.66 Pa (0.5 Torr); flow rates of a $SiH_4$ gas and a $H_2$ gas which are introduced from a gas introduction system into a chamber, 25 and 150 sccm, respectively; and a discharge frequency and an application RF power from a high frequency power supply, 27.12 MHz and 30 W (an RF power density of 0.5 $W/cm^2$), respectively. Note that the amorphous silicon film used in the present invention is not limited to one which is deposited under the above deposition conditions and a material gas or the like may be appropriately selected by a practitioner.

In addition, a 50 nm thick amorphous germanium film which is deposited by a plasma CVD method is used for the germanium film. The amorphous germanium film is deposited under the following conditions: a substrate temperature is set at 300 C.°; a distance between electrodes of a parallel plate (a TS distance), 20 mm; a pressure in a chamber, 60 Pa (0.45 Torr); a flow rate of a $GeH_4$, which is diluted with Ar by 5%, introduced from a gas introduction system into a chamber, 100 sccm; and a discharge frequency and an application RF power from a high frequency power supply, 27.12 MHz and 30 W (an RF power density of 0.5 $W/cm^2$), respectively. Note that the germanium film used in the present invention is not limited to one which is deposited under the above deposition conditions and a material gas or the like may be appropriately selected by a practitioner.

In addition, a tungsten film is used as the first electrode, and a titanium film is used as the second electrode. Note that a silicide does not have to be formed over an entire region of the antifuse-type ROM of the present invention where the silicon film and the first electrode are in contact with each other, but it is acceptable as long as part of the region where the silicon film and the first electrode are in contact with each other is conductive by the silicide which is partially formed.

Data is written to a plurality of memory element having a stacked-layer structure shown in FIG. 1B. Writing voltages and consumption currents of arbitrary 25 memory elements of the plurality of memory elements are measured, and maximum values, minimum values, and average values are shown in Table 1.

TABLE 1

A 50 nm germanium film over a 50 nm silicon film

|  | Writing Voltage (V) | Consumption current (µA) |
|---|---|---|
| Max | 6.9 | 10.4 |
| Min | 6.2 | 1.6 |
| Ave | 6.7 | 4.5 |

In addition, for comparison, a memory element in which a 50 nm thick amorphous silicon film in a single layer is interposed between a pair of electrodes is manufactured and measurement thereof is performed similarly. Table 2 shows the measurement result.

TABLE 2

Ref. A 50 nm amorphous silicon film

|  | Writing Voltage (V) | Consumption current (µA) |
|---|---|---|
| Max | 6.0 | 9.0 |
| Min | 4.8 | 2.3 |
| Ave | 5.5 | 5.8 |

In the memory element in a single layer for comparison, a distance between the pair of electrodes is 50 nm. When the distance between the pair of electrodes is 100 nm for comparison, it is considered that values almost twice as large as the values in Table 2 are obtained. Thus, when the memory element having a single-layer structure and the memory element having a stacked-layer structure are the same in distance between the pair of electrodes, the memory element having a stacked-layer structure shown in FIG. 1B can drastically reduce power consumption at the time of writing, as compared with the memory element in a single layer.

Figure 2:
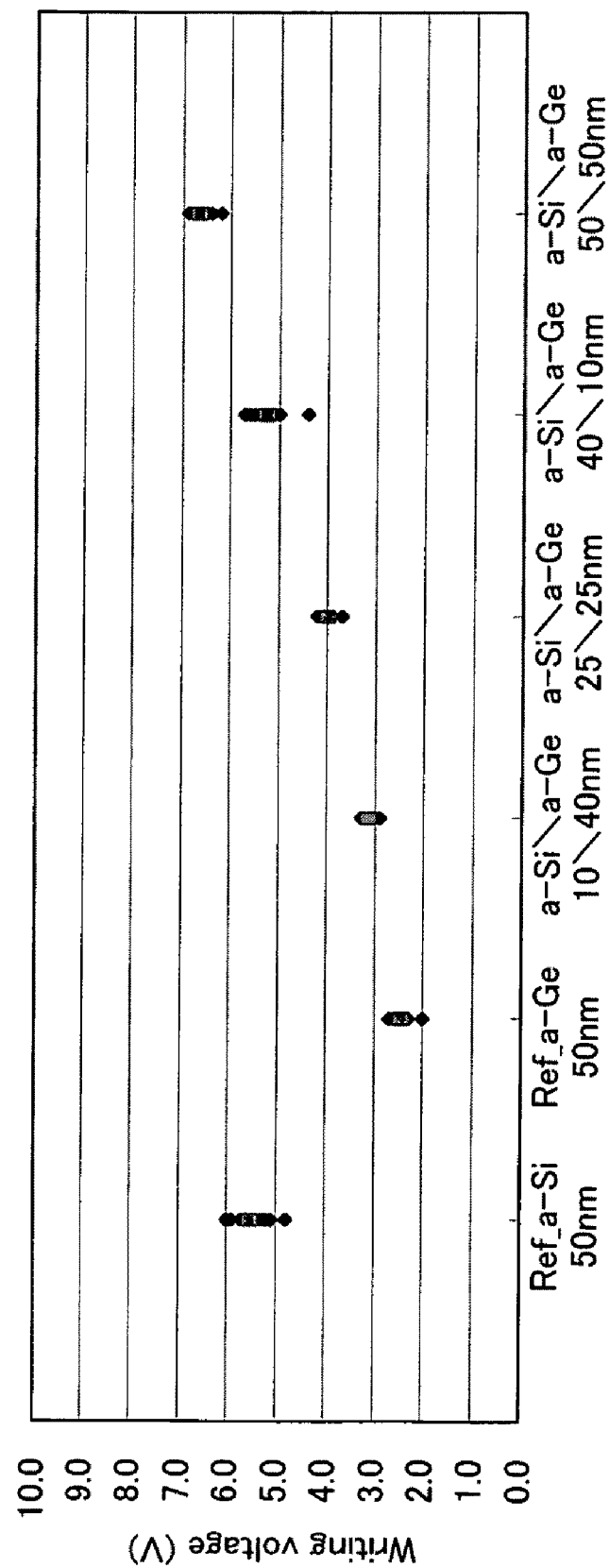
FIG. 2 is a graph showing a writing voltage value of an antifuse-type ROM.

In addition, FIG. 2 shows fluctuation in writing voltage of another memory element for comparison (the memory element having a silicon film in a single layer between a pair of electrodes). Further, FIG. 2 also shows fluctuation in writing voltage of another memory element for comparison (the memory element having a germanium film in a single layer between a pair of electrodes).

Besides, four kinds of samples each having a stacked-layer structure between a pair of electrodes are manufactured and writing voltages are measured. FIG. 2 shows the measurement results. A memory element of which size is 2 µm×2 µm is used for any of the samples. FIG. 2 shows fluctuation in writing voltage of each of the following: a memory element having stacked layers of a 10 nm thick amorphous silicon film and a 40 nm thick amorphous germanium film; a memory element having stacked layers of a 25 nm thick amorphous silicon film and a 25 nm thick amorphous germanium film; a memory element having stacked layers of a 40 nm thick amorphous silicon film and a 10 nm thick amorphous germanium film; and a memory element having stacked layers of a 50 nm thick amorphous silicon film and a 50 nm thick amorphous germanium film.

It can be understood from FIG. 2 that fluctuation in writing voltage of a memory element having a stacked-layer structure between a pair of electrodes can be reduced, as compared with writing voltage of a memory element having a single-layer structure between a pair of electrodes. When the layer interposed between the pair of electrodes has a stacked-layer structure in such a manner, thickness of an amorphous silicon film and a germanium film is not particularly limited, and fluctuation in writing voltage can be reduced more when the germanium film is thicker than the amorphous silicon film. When a writing voltage value of a memory element of which fluctuation in writing voltage is reduced is set at a certain value (a value at least larger than the writing voltage value) in a writing circuit, the memory element can be said to be superior in writing which can be performed certainly. In particular, the memory element is useful as a memory element which is mounted on a wireless chip to form a power supply from a wireless signal.

Figure 3:
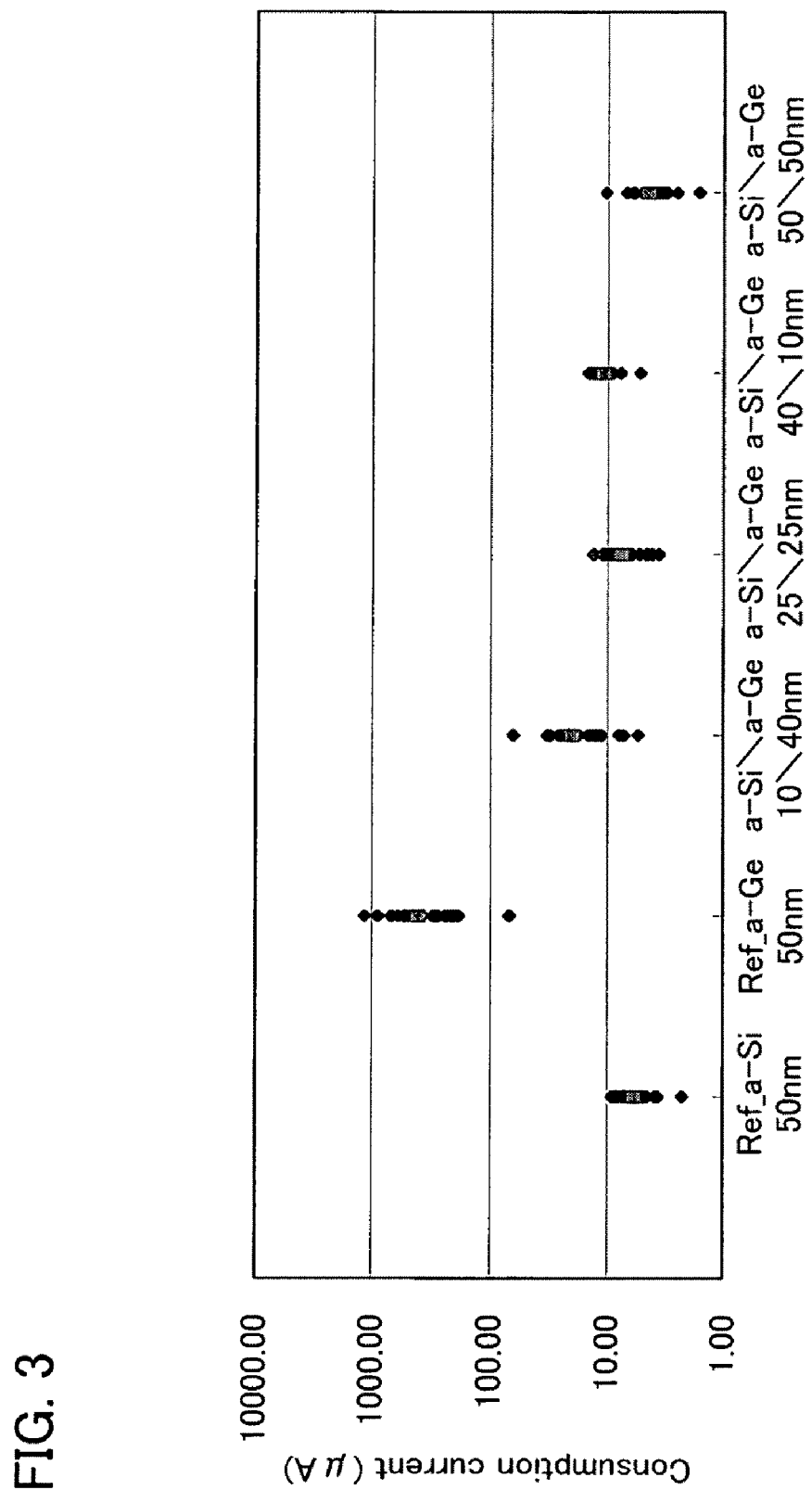
FIG. 3 is a graph showing a consumption current value of an antifuse-type ROM.

In addition, a consumption current value is measured with the use of the same samples as the measurement in FIG. 2, and FIG. 3 shows fluctuation in the consumption current value.

In the memory element having a germanium film in a single layer, a writing voltage value is lowest and a consumption current value is high; thus, it can be said that the memory element is unsuitable to be mounted on a wireless chip for forming a power supply from a wireless signal.

Power consumption in writing to short-circuit the pair of electrodes by voltage application to a memory element corresponds to a writing voltage value×a consumption current value. Thus, it can be understood from FIGS. 2 and 3 that, in a sample of which power consumption is most reduced, an amorphous silicon film and a germanium film each have a thickness of 25 nm. Besides, in the sample, both fluctuation in writing voltage and fluctuation in consumption current are relatively reduced as compared with other samples.

Accordingly, it can be said from the graphs shown in FIGS. 2 and 3 that a memory element having a stacked-layer structure is superior in terms of power consumption as compared with a memory element having a single-layer structure.

Embodiment Mode 2

A manufacturing process of a semiconductor device of the present invention will be described with reference to FIGS. 4A and 4B. A cross-sectional structure shown in FIG. 4A is a process diagram in the middle of manufacturing process of the semiconductor device.

First, a separation layer 102 and an insulating layer 103 are formed over a substrate 101 having an insulating surface. A quartz substrate, a glass substrate, or the like can be used as the substrate 101 having an insulating surface. In particular, a glass substrate which can have a large area of over 1 m on each side is suitable for mass production. A tungsten film having a thickness of 50 to 200 nm is used as the separation layer 102, and a silicon oxide film is used as the insulating layer 103. Note that the separation layer 102 is not limited to a tungsten film, and a tungsten nitride film, a molybdenum film, an amorphous silicon film, or the like may be used. In addition, the insulating layer 103 is not limited to a silicon oxide film, and a silicon oxynitride film or a stacked film of a silicon oxide film and a silicon oxynitride film can be used.

Next, a plurality of semiconductor layers are formed over the insulating layer 103. The plurality of semiconductor layers may be formed by a known method. Here, a semiconductor film having a crystal structure is used, which is formed in such a manner that an amorphous silicon film is formed by a known method (a sputtering method, an LPCVD method, a plasma CVD method, or the like), and then the amorphous silicon film is crystallized by known crystallization treatment (a laser crystallization method, a thermal crystallization method, a thermal crystallization method using a catalyst such as nickel, or the like). The plurality of semiconductor layers serve as an active layer of a thin film transistor to be manufactured later. It is preferable to use a semiconductor film having a crystal structure for the active layer of a thin film transistor in order to realize high-speed driving of a driver circuit. High-speed driving of the driver circuit is realized, so that high-speed reading of memory can be realized.

Next, a gate insulating film 104 which covers the plurality of semiconductor layers is formed. The gate insulating film 104 is formed of a single layer or a stacked-layer structure of an insulating film containing silicon. The gate insulating film 104 is formed to have a thickness of 1 to 200 nm by a plasma CVD method or a sputtering method. Alternatively, the gate insulating film 104 may be formed in such a manner that an insulating film containing silicon is formed to be as thin as 10 to 50 nm with a single-layer structure or a stacked-layer structure, and surface nitriding treatment using microwave plasma is performed on the insulating film.

Next, a first gate electrode 105 and a second gate electrode 106 which overlap with the semiconductor layers with the gate insulating film 104 interposed therebetween, and one of electrodes of an antifuse-type ROM, that is, a first gate electrode 107 are formed in the same step. The first gate electrode 105, the second gate electrode 106, and the first electrode 107 may be formed in such a manner that a conductive film formed of a single substance such as titanium (Ti), tungsten (W), nickel (Ni), chromium (Cr), molybdenum (Mo), tantalum (Ta), cobalt (Co), zirconium (Zr), vanadium (V), palladium (Pd), hafnium (Hf), platinum (Pt) or iron (Fe), or an alloy or a compound thereof is formed by a sputtering method and processed into a desired shape. A material which has both a characteristic suitable for the gate electrode of a TFT and a characteristic suitable for one of the electrodes of the antifuse-type ROM is selected. In this embodiment mode, a tungsten film is used. The tungsten film reacts with silicon to form a tungsten-silicide, thereby being suitable for one of the electrodes of the antifuse-type ROM. Further, since the tungsten film is a material which has a relatively high work function, threshold voltages of both a p-channel transistor and an n-channel transistor are low, and the p-channel transistor and the n-channel transistor are roughly symmetric to each other; thus, the tungsten film is one of preferable materials for the gate electrode.

Next, in order to add an impurity element imparting n-type conductivity to the semiconductor layer, steps of forming a first resist mask which covers a region to be the p-channel TFT and performing doping with the use of the first resist mask and the first gate electrode 105 as masks are performed. The impurity element imparting n-type conductivity is added to the semiconductor layer, so that n-type impurity regions are formed in a self-aligned manner. Later, these n-type impurity regions each serve as a source region 108 or a drain region 109 of the n-channel TFT. In addition, a region of the semiconductor layer which overlaps with the first gate electrode 105 serves as a channel formation region 112. The step of doping may be performed by an ion doping method or an ion implantation method. As the impurity element imparting n-type conductivity which is added to the semiconductor layer, phosphorus (P) or arsenic (As) is typically used.

Then, after the first resist mask is removed, in order to add an impurity element imparting p-type conductivity to the semiconductor layer, steps of forming a second resist mask which covers a region to be the n-channel TFT and performing doping with the use of the second resist mask and the second gate electrode 106 as masks are performed. The impurity element imparting p-type conductivity (typically, boron) is added to the semiconductor layer, so that p-type impurity regions are formed in a self-aligned manner. Later, these p-type impurity regions each serve as a source region 111 or a drain region 110 of the p-channel TFT. In addition, a region of the semiconductor layer which overlaps with the second gate electrode 106 serves as a channel formation region 113.

After that, the second resist mask is removed. Through the preceding steps, the impurity regions with n-type or p-type conductivity are formed in each semiconductor layer. Note that the example in which the impurity element imparting n-type conductivity is added before the impurity element imparting p-type conductivity is added is described here; however, there is no particular limitation on the doping order.

In addition, before these doping steps, an insulator which is referred to as a sidewall may be formed on side surfaces of the gate electrode, and LDD regions which are adjacent to the channel formation region may be formed. The LDD region may be formed using a new resist mask although the number of masks is increased. A region, to which an impurity element is added at a low concentration, is provided between a channel formation region and a source region or a drain region which is formed by addition of an impurity element at a high concentration, and the region is referred to as an LDD region. When the LDD region is provided, an off current value of the TFT can be reduced.

In addition, if necessary, a small amount of impurity elements (boron or phosphorus) may be doped into the semiconductor layer in order to control a threshold value of the TFT.

Next, activation of the impurity element added to the semiconductor layer or hydrogenation of the semiconductor layer is performed by a known technique. The activation of the impurity element or the hydrogenation of the semiconductor layer is performed by high-temperature heat treatment in a furnace or heat treatment using lamp light or laser light; therefore, a material which can withstand a treatment temperature is used for the first gate electrode 105, the second gate electrode 106, and the first electrode 107 which are formed before the activation step or the hydrogenation step. Needless to say, the tungsten film which is used here for the first gate electrode 105, the second gate electrode 106, and the first electrode 107 is a high melting point metal and is a material which can sufficiently withstand the activation of the impurity element or the hydrogenation of the semiconductor layer.

Next, an interlayer insulating film 114 which covers the first gate electrode 105, the second gate electrode 106, and the first electrode 107 is formed. The interlayer insulating film 114 is formed of an inorganic insulating film by a sputtering method, an LPCVD method, a plasma CVD method, or the like. An insulating film in a single layer or stacked layers such as a silicon oxide film, a silicon nitride film, or a silicon oxynitride film is used as the inorganic insulating film. This interlayer insulating film 114 also functions as a partition wall which insulates adjacent memory elements. Since voltage is applied to the antifuse-type ROM to form a silicide, an area around the memory element instantaneously has high temperature. Therefore, the interlayer insulating film 114 is preferably formed of an inorganic insulating material which can withstand a temperature at which a silicide reaction is formed.

Alternatively, as one layer of the inorganic insulating film, a siloxane resin with high heat resistance which can be obtained by a coating method may be used. Note that a siloxane resin corresponds to a resin containing a Si—O—Si bond. Siloxane has a skeleton structure including a bond of silicon (Si) and oxygen (O). As a substituent, an organic group containing at least hydrogen (for example, an alkyl group or aromatic hydrocarbon) is used. Alternatively, a fluoro group may be used as the substituent. Further alternatively, an organic group containing at least hydrogen and a fluoro group may be used as the substituent.

Next, a resist mask is formed using a photomask, and either the interlayer insulating film 114 or the gate insulating film 104 is selectively etched to form an opening. As the etching, wet etching or dry etching may be performed, or a combination thereof may be performed. Then, the resist mask is removed. There are three types for the opening formed here: an opening which reaches the semiconductor layer; an opening which reaches the gate electrode of the TFT; and an opening which reaches the first electrode 107. Further, two types of openings which reach the first electrode 107 are provided: a first opening in which a silicon film and a germanium film are later stacked and a second opening in which a wiring electrically connected to the first electrode 107 is later formed.

The first opening which reaches the first electrode 107, which is formed in this etching step, has a diameter of its bottom of the opening which is approximately 1 to 6 µm. However, the first opening is preferably small because consumption current is increased, as the diameter of the first opening is larger. Note that the size of the opening is indicated in diameter; however, the shape of a top surface of the opening is not limited to a round but may be an oblong or a rectangle.

In addition, in order to reduce the number of steps, the opening which reaches the semiconductor layer, the opening which reaches the gate electrode of the TFT, and the first opening and the second opening which reaches the first electrode 107 can be formed by one etching by adjustment of an etching condition.

In the preceding steps, part of the antifuse-type ROM is formed through the same steps as the manufacturing steps of the TFT; therefore, the number of steps is not increased.

Next, a silicon film 115a and a germanium film 115b are stacked so as to cover the first opening which reaches the first electrode 107. The silicon film 115a can be formed using an amorphous silicon film, a microcrystalline silicon film, or a polysilicon film by a sputtering method, an LPCVD method, a plasma CVD method, or the like. In addition, the germanium film 115b can be formed using an amorphous germanium film or a microcrystalline germanium film by a sputtering method, an LPCVD method, a plasma CVD method, or the like. Here, an amorphous silicon film and an amorphous germanium film which are obtained by a plasma CVD method are used.

The thickness of the stacked layers of the silicon film 115a and the germanium film 115b is 10 to 200 nm.

Further, oxygen or nitrogen may be purposely contained in the silicon film which is used for the antifuse-type ROM. Steps between the above-described etching step and the step of forming the silicon film are not steps performed continuously without exposure to the air. More nitrogen or oxygen is contained at an interface between the silicon film 115a and the first electrode 107 than in other region of the silicon film 115a. In the antifuse-type ROM, at least the silicon film 115a and the first electrode 107 are not continuously stacked. Oxygen or nitrogen is contained in the silicon film 115a, so that a gap of electrical resistance between before and after writing to the antifuse-type ROM can be widen. In addition, when the opening is exposed to the air after being formed, there is a case where a thin natural oxide film is formed on a surface of the exposed tungsten film. Moreover, also by formation of the natural oxide film on the surface of the tungsten film, the natural oxide film can function as a buffer layer; thus, these films can sufficiently function as a memory element of the antifuse-type ROM.

Since one mask is needed for patterning the silicon film 115a and the germanium film 115b, the number of steps is increased due to a film formation step and a patterning step thereof.

Next, an exposed surface of the semiconductor layer is washed at the same time as removal of an oxide film on a surface of the semiconductor layer with an etchant containing hydrofluoric acid. Note that it is necessary to be careful so that the silicon film 115a and the germanium film 115b are not etched and eliminated by this washing step.

Next, a metal film is stacked by a sputtering method. Then, a resist mask is formed using a photomask and the metal stacked film is selectively etched, so that source electrodes 116 and 118 and a drain electrode 117 of the TFT are formed in a driver circuit portion 140; a second electrode 120 and a third electrode 119 of the antifuse-type ROM are formed in a memory portion 130; and a connection electrode 121 is formed in an antenna portion 150. The connection electrode 121 is electrically connected to an antenna and a power supply formation circuit to be formed later.

In addition, the third electrode 119 is electrically connected to the first electrode 107, so that a wiring is led; accordingly, reduction in power consumption is achieved. In the case of an active-type memory, the third electrode 119 electrically connects a switching element to the first electrode 107. In the case of a passive-type memory, the first electrodes 107 may be arranged in parallel in a stripe form (strip form) and the second electrodes 120 may be arranged in parallel in a stripe form so as to be perpendicular to the first electrodes 107. In the case of the passive-type memory, the third electrode 119 is provided at an end portion to serve as a lead electrode.

Note that the metal stacked film here has a three-layer stacked structure of a titanium film having a thickness of 50 to 200 nm, a pure aluminum film having a thickness of 100 to 400 nm, and a titanium film having a thickness of 50 to 200 nm. At least a layer in contact with the germanium film 115b of the metal stacked film is formed using a conductive material which reacts with germanium or a conductive material in which germanium is diffused.

In addition, since the titanium film is used for this metal stacked film, contact resistance with other conductive material is low, and further, since the pure aluminum film is used and a wiring resistance value is low, it is effective to use the metal stacked film for a lead wiring of the driver circuit portion, a lead wiring of the memory portion, and a connection portion of the antenna portion.

In this manner, as shown in FIG. 4A, over the substrate 101 having an insulating surface, the separation layer 102 and the insulating layer 103 are provided, and thereover, the antifuse-type ROM is provided in the memory portion 130, and a CMOS circuit including the n-channel TFT and the p-channel TFT is provided in the driver circuit portion 140. The second electrode 120 of the antifuse-type ROM is formed through the same step as the source electrodes 116 and 118 and the drain electrode 117 of the TFT, so that the number of steps is reduced. Besides, the connection electrode 121 of the antenna portion is formed through the same step as the source electrodes 116 and 118 and the drain electrode 117, so that contact resistance in a connection portion between the antenna and the power supply formation circuit and noise can be reduced.

Then, an insulating film 122 which covers the source electrodes 116 and 118, the drain electrode 117, the second electrode 120, the third electrode 119, and the connection electrode 121 is formed. This insulating film 122 may be an inorganic insulating film or stacked layers of an inorganic insulating film and an organic insulating film.

Next, a resist mask is formed and the insulating film 122 is selectively etched, so that an opening which reaches the third electrode 119 and an opening which reaches the connection electrode 121 are formed. Note that a size of the opening which reaches the connection electrode 121 is made relative large or a plurality of openings are provided in order to ensure electrical connection with an antenna to be formed later.

Then, the resist mask is removed, and a metal layer 124 for improving adhesion of the antenna and a fourth electrode 123 are formed. The metal layer 124 and the fourth electrode 123 are formed using a titanium film, a copper film, an aluminum film, or the like through the same step. The metal layer 124 and the fourth electrode 123 are formed by a sputtering method or an ink jetting method. In the case of employing a sputtering method, after the metal layer is formed, a resist mask is formed, selective etching is performed, and the resist mask is removed.

Next, an antenna 125 is formed by a sputtering method or a printing method. In the case of forming the antenna 125 by a screen printing method or an ink jetting method, a conductive paste in which conductive particles with a grain diameter of several nm to several tens μm are dissolved or dispersed in an organic resin is selectively printed, and then, baking for reducing electric resistance is performed.

As the conductive particles, metal particles of one or more kinds of silver (Ag), gold (Au), copper (Cu), nickel (Ni), platinum (Pt), palladium (Pd), tantalum (Ta), molybdenum (Mo), titanium (Ti), or the like, fine particles of silver halide, or dispersive nanoparticles can be used. In addition, as the organic resin contained in the conductive paste, one or more of organic resins selected from organic resins which function as a binder, a solvent, a dispersive agent, and a coating member for the metal particles can be used. Typically, an organic resin such as an epoxy resin or a silicone resin can be used. Further, when the conductive film is formed, baking is preferably performed after the conductive paste is applied. For example, in the case where fine particles containing silver as its main component (for example, a grain size of greater than or equal to 1 nm and less than or equal to 100 nm) is used for a material of the conductive paste, a conductive film can be obtained by baking of the paste at temperatures of 150 to 300° C. so as to be cured. Alternatively, fine particles containing solder or lead-free solder as its main component may be used. In this case, fine particles having a grain size of less than or equal to 20 μm are preferably used. Solder and lead-free solder have an advantage of being low cost.

In the case of forming the antenna 125 by a screen printing method, it is effective to provide the metal layer 124 as a base film when adhesion of the antenna 125 with the insulating film 122 is low. The antifuse-type ROM, the driver circuit, and the antenna are formed over the same substrate, so that a mounting step can be reduced. Mounting here means a work of electrically connecting a base provided with the antenna to the driver circuit by a solder, thermocompression bonding, wire bonding, bump bonding, or the like. For example, mounting is performed when a silicon chip is attached to the antenna provided for the base.

There is no particular limitation on the shape of the antenna 125. As a transmission method of a signal applied to the antenna, an electromagnetic coupling method, an electromagnetic induction method, a microwave method, or the like can be employed. The transmission method may be appropriately selected by a practitioner in consideration of applications, and an antenna having an optimal length and shape may be provided in accordance with the transmission method.

For example, in the case of employing an electromagnetic coupling method or an electromagnetic induction method (for example, 13.56 MHz band) as the transmission method, electromagnetic induction by change of the electric field density is utilized; therefore, a conductive film which functions as an antenna is formed into a circular shape (for example, a loop antenna) or a spiral shape (for example, a spiral antenna).

In the case of employing a microwave method (for example, a UHF band (860 to 960 MHz band), a 2.45 GHz band, or the like) as the transmission method, the length or the shape of the conductive film which functions as an antenna may be appropriately set in consideration of the wavelength of a radio wave used for signal transmission. The conductive film which functions as an antenna can be formed in, for example, a linear shape (for example, a dipole antenna), a flat shape (for example, a patch antenna), or the like. The shape of the conductive film which functions as an antenna is not limited to a linear shape, and the conductive film which functions as an antenna may be formed in a curved-line shape, a meander shape, or a combination thereof, in consideration of the wavelength of the electromagnetic wave.

Figure 5A:
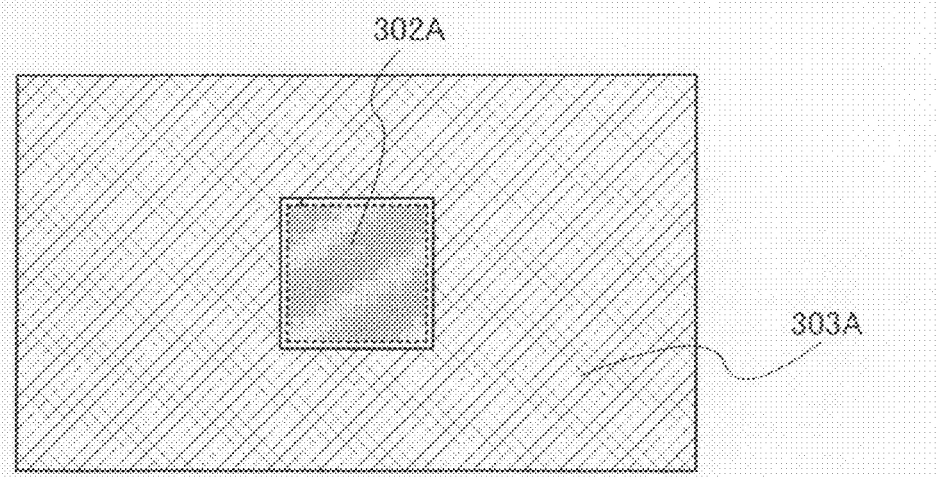
FIGS. 5A to 5E are top views each showing an antenna.
Figure 5B:
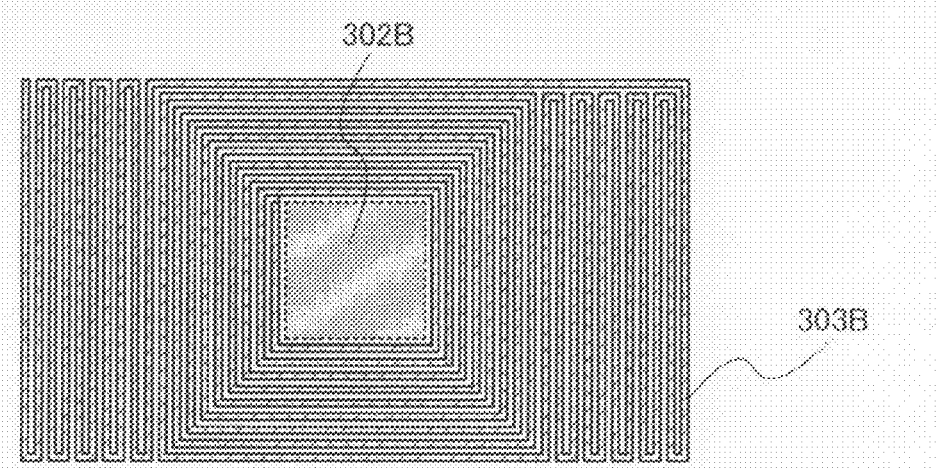
Figure 5C:
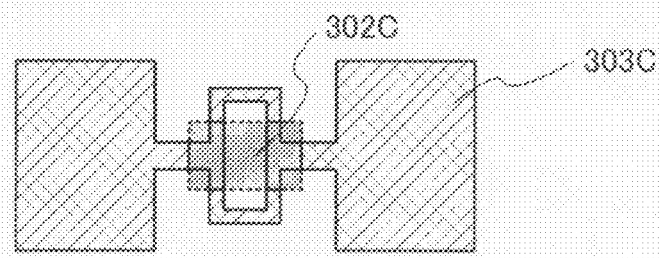
Figure 5D:
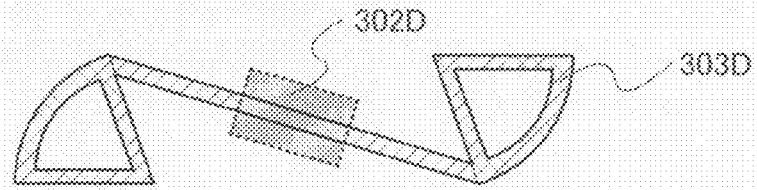
Figure 5E:
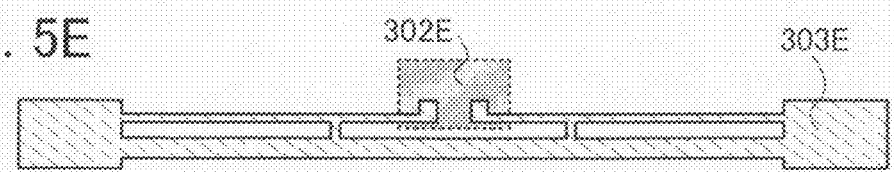

FIGS. 5A to 5E show examples of shapes of the antenna. For example, as shown in FIG. 5A, an antenna 303A may be provided all around a memory portion and driver circuit 302A. As shown in FIG. 5B, a thin antenna 303B may be provided around a memory portion and driver circuit 302B so as to circle around the memory portion and driver circuit 302B. As shown in FIG. 5C, the antenna may have a shape like an antenna 303C for receiving a high-frequency electromagnetic wave with respect to a memory portion and driver circuit 302C. As shown in FIG. 5D, the antenna may have a shape like an antenna 303D which is 180° omnidirectional (capable of receiving signals in any direction) with respect to a memory portion and driver circuit 302D. As shown in FIG. 5E, the antenna may have a shape like an antenna 303E which is extended to be long like a stick with respect to a memory portion and driver circuit 302E. The antenna 125 may be used in combination with the antennas with these shapes.

An appropriate length needed for the antenna is different depending on frequency used for reception. In general, the length may be 1/n (n is an integer) of a wavelength, for example, approximately 60 mm (½ wavelength) or approximately 30 mm (¼ wavelength) when the frequency is 2.45 GHz.

Next, separation is performed at an interface or inside of the separation layer 102, and an element layer in which the TFT, the memory element, and the like are formed is sealed with a first sheet 100a and a second sheet 100b. There is no particular limitation on a separation method. A known separation method such as a peeling method utilizing a surface oxide film of a tungsten film of a separation layer (the technology described in Japanese Published Patent Application No. 2004-214281), a separation method in which a separation layer is etched, or a separation method utilizing laser ablation may be used. In addition, sealing may be performed by bonding with the use of a bonding layer such as an epoxy resin. Moreover, the order of a separation step and an antenna formation step may be switched; the antenna may be formed by a screen printing method after separation.

A plastic film or paper is used for the first sheet 100a and the second sheet 100b. Alternatively, thin ceramic may be used for the first sheet 100a and the second sheet 100b in order to increase withstand voltage, or a sheet in which a fabric formed of carbon fiber or glass fiber is impregnated with a resin, a so-called prepreg may be used. If a flexible material is used as a material of the first sheet 100a and the second sheet 100b, a wireless chip which is suitable for being attached to a curved surface of an article can be provided.

Through the above-described steps, the antifuse-type ROM and the driver circuit are formed over the same substrate. Further, the antifuse-type ROM, the driver circuit, and the antenna can be formed over the same substrate through a small number of steps.

The present invention including the above-described structure will be described further in detail in the following embodiments.

Embodiment 1

In this embodiment, a manufacturing method of a wireless chip including an active matrix antifuse-type ROM will be described below with reference to FIGS. 6A to 6D and FIGS. 7A to 7C.

First, a metal layer 502 which serves as a separation layer is formed over a substrate 501. A glass substrate is used as the substrate 501. A tungsten film, a tungsten nitride film, or a molybdenum film having a thickness of 30 to 200 nm which is obtained by a sputtering method is used for the metal layer 502.

Next, a surface of the metal layer 502 is oxidized to form a metal oxide layer (not shown). The metal oxide layer may be formed by oxidation of the surface with pure water or ozone water, or oxidation with oxygen plasma. Alternatively, the metal oxide layer may be formed by heating in an atmosphere containing oxygen. Further alternatively, the metal oxide layer may be formed in a later step of forming an insulating film. In this case, when a silicon oxide film or a silicon oxynitride film is formed as the insulating film by a plasma CVD method, the surface of the metal layer 502 is oxidized, so that the metal oxide layer is formed.

Next, a first insulating film 503 is formed over the metal oxide layer. An insulating film such as a silicon oxide film, a silicon nitride film, or a silicon oxynitride film ($SiO_xN_y$) is used as the first insulating film 503. As a typical example, the first insulating film 503 is formed of a two-layer structure, and a structure is employed in which, by a PCVD method, a silicon nitride oxide film having a thickness of 50 to 100 nm which is formed using $SiH_4$, $NH_3$, and $N_2O$ as reactive gases, and a silicon oxynitride film having a thickness of 100 to 150 nm which is formed using $SiH_4$ and $N_2O$ as reactive gases are stacked. Alternatively, as one layer of the first insulating film 503, a silicon nitride film (SiN film) or a silicon oxynitride film ($SiN_xO_y$ film (X>Y)) each having a thickness of less than or equal to 10 nm is preferably used. Alternatively, a three-layer structure may be employed in which a silicon nitride oxide film, a silicon oxynitride film, and a silicon nitride film are sequentially stacked. Although the example in which the first insulating film 503 is formed as a base insulating film is described here, the first insulating film 503 is not necessarily provided if it is not particularly needed.

Next, a semiconductor layer is formed over the first insulating film 503. The semiconductor layer is formed as follows: a semiconductor film having an amorphous structure is formed by a known method (a sputtering method, an LPCVD method, a plasma CVD method, or the like), and then crystallized by known crystallization treatment (a laser crystallization method, a thermal crystallization method, a thermal crystallization method using a catalyst such as nickel, or the like) to obtain a crystalline semiconductor film, and the crystalline semiconductor film is patterned into a desired shape after a resist mask is formed using a first photomask. Note that the first insulating film and the semiconductor film having an amorphous structure can be continuously stacked without exposure to the air, with a plasma CVD method. This semiconductor film is formed to have a thickness of 25 to 80 nm (preferably 30 to 70 nm). Although there is no limitation on a material of the amorphous semiconductor film, silicon or a silicon germanium (SiGe) alloy is preferably used to form the amorphous semiconductor film.

Alternatively, for crystallization treatment of the semiconductor film having an amorphous structure, a continuous wave laser may be used. In order to obtain a crystal with a large grain size in crystallization of the amorphous semiconductor film, second to fourth harmonics of the fundamental wave is preferably employed using a solid laser capable of continuous wave oscillation. Typically, the second harmonic (532 nm) or the third harmonic (355 nm) of an Nd:$YVO_4$ laser (fundamental wave of 1064 nm) may be employed. When a continuous wave laser is used, laser light emitted from a continuous wave $YVO_4$ laser of which output power is 10 W is converted into a harmonic by a non-linear optical element. In addition, there is a method by which YVO$_4$ crystal and a non-linear optical element are put in an oscillator and a harmonic wave is emitted. Then, the laser light is preferably shaped into a rectangular or elliptical shape on an irradiation surface by an optical system and is emitted to the semiconductor film. At this time, an energy density of about 0.01 to 100 MW/cm$^2$ (preferably, 0.1 to 10 MW/cm$^2$) is needed. Then, the semiconductor film may be moved at a speed of approximately 10 to 2000 cm/s relatively to the laser light so as to be irradiated.

Next, the resist mask is removed. Then, if necessary, the semiconductor layer is doped with a small amount of impurity elements (boron or phosphorus) in order to control a threshold value of a TFT. Here, an ion doping method is employed in which diborane (B$_2$H$_6$) is not separated by mass but excited by plasma.

Next, a surface of the semiconductor layer is washed at the same time as removal of an oxide film on the surface of the semiconductor layer with an etchant containing hydrofluoric acid.

Then, a second insulating film which covers the semiconductor layer is formed. The second insulating film is formed to have a thickness of 1 to 200 nm by a plasma CVD method or a sputtering method. The second insulating film is preferably formed to be as thin as 10 to 50 nm to have a single layer or stacked-layer structure of an insulating film containing silicon, and then surface nitridation treatment using plasma with a microwave is performed. The second insulating film functions as a gate insulating film of a TFT to be formed later.

Next, gate electrodes 504 to 508 and a first electrode 509 which serves as a lower electrode of the antifuse-type ROM are formed over the second insulating film. A resist mask is formed using a second photomask, and then a conductive film having a thickness of 100 to 500 nm which is obtained by a sputtering method is patterned into a desired shape, so that the gate electrodes 504 to 508 and the first electrode 509 are formed.

A material of the gate electrodes 504 to 508 and the first electrode 509 is acceptable as long as the material reacts with silicon to form a silicide. The gate electrodes 504 to 508 and the first electrode 509 may be formed of an element in a single layer which is selected from titanium (Ti), tungsten (W), nickel (Ni), chromium (Cr), molybdenum (Mo), tantalum (Ta), cobalt (Co), zirconium (Zr), vanadium (V), palladium (Pd), hafnium (Hf), platinum (Pt), and iron (Fe), or an alloy material or a compound material containing the element as its main component, or stacked layers thereof. Note that a high melting point metal is preferably used for the gate electrode of the TFT; thus, tungsten or molybdenum is used. In the case where the gate electrodes 504 to 508 and the first electrode 509 are formed of stacked layers, if a material layer which serves as an upper layer is formed of the above-described material, a material layer which serves as a lower layer may be a polycrystalline silicon layer doped with an impurity element such as phosphorus.

Next, a resist mask is formed using a third photomask so as to cover the semiconductor layers in regions to be p-channel TFTs, and an impurity element is introduced into the semiconductor layers in regions to be n-channel TFTs, using the gate electrodes 505 and 507 as masks, so that low concentration impurity regions are formed. As the impurity element, an impurity element imparting n-type conductivity or an impurity element imparting p-type conductivity can be used. As the impurity element imparting n-type conductivity, phosphorus (P), arsenic (As), or the like can be used. Here, phosphorus (P) is introduced into the semiconductor layer in the regions to be the n-channel TFTs so as to be contained at concentrations of $1\times10^{15}$ to $1\times10^{19}$/cm$^3$, so that n-type impurity regions are formed.

Next, the resist mask is removed. A resist mask is formed using a fourth photomask so as to cover the semiconductor layers in the regions to be the n-channel TFTs, and an impurity element is introduced into the semiconductor layers in the regions to be the p-channel TFTs, using the gate electrodes 504, 506, and 508 as masks, so that p-type impurity regions are formed. As the impurity element imparting p-type conductivity, boron (B), aluminum (Al), gallium (Ga), or the like can be used. Here, boron (B) is introduced into the semiconductor layer in the regions to be the p-channel TFTs so as to be contained at concentrations of $1\times10^{19}$ to $1\times10^{20}$/cm$^3$, so that the p-type impurity regions can be formed. Consequently, source or drain regions 514 and 515 and a channel formation region 516 are formed in the semiconductor layer in the region to be the p-channel TFT.

Next, sidewalls 510 and 511 are formed on both side surfaces of the gate electrodes 504 to 508 and the first electrode 509. A formation method of the sidewalls 510 is as follows. First, a third insulating film is formed to have a single-layer structure or a stacked-layer structure of a film containing an inorganic material such as silicon, an oxide of silicon, or a nitride of silicon, or a film containing an organic material such as an organic resin by a plasma CVD method, a sputtering method, or the like so as to cover the second insulating film, the gate electrodes 504 to 508, and the first electrode 509. Then, the third insulating film is selectively etched by anisotropic etching mainly in a perpendicular direction to form insulating films (the sidewalls 510) which are in contact with the side surfaces of the gate electrodes 504 to 508 and the first electrode 509. Note that part of the second insulating film is removed by being etched at the same time as the formation of the sidewalls 510. Part of the second insulating film is removed, so that a remaining gate insulating layer 512 is formed under each of the gate electrodes 504 to 508 and the sidewalls 510. In addition, part of the second insulating film is removed, so that a remaining insulating layer 513 is formed under the first electrode 509 and the sidewalls 511.

Next, a resist mask is formed using a fifth photomask so as to cover the semiconductor layers in regions to be the p-channel TFTs, and an impurity element is introduced into the semiconductor layers in the regions to be the n-channel TFTs, using the gate electrodes 505 and 507 and the sidewalls 510 as masks, so that high concentration impurity regions are formed. The resist mask is removed after the impurity element is introduced. Here, phosphorus (P) is introduced into the semiconductor layer in the regions to be the n-channel TFTs so as to be contained at concentrations of $1\times10^{19}$ to $1\times10^{20}$/cm$^3$, so that n-type high concentration impurity regions can be formed. Consequently, source or drain regions 517 and 518, LDD regions 519 and 520, and a channel formation region 521 are formed in the semiconductor layer in the region to be the n-channel TFT. The LDD regions 519 and 520 are formed below the sidewalls 510.

The structure is described in which the LDD regions are formed in the semiconductor layer included in the n-channel TFT and LDD regions are not formed in the semiconductor layer included in the p-channel TFT. Needless to say, however, the present invention is not limited thereto. The LDD regions may be formed in the semiconductor layers included in both the n-channel TFT and the p-channel TFT.

Next, a fourth insulating film 522 containing hydrogen is deposited by a sputtering method, an LPCVD method, a plasma CVD method, or the like, and then activation treatment and hydrogenation treatment of the impurity element added to the semiconductor layer are performed. Heat treatment (at a temperature of 300 to 550° C. for 1 to 12 hours) in a furnace or a rapid thermal annealing method (RTA method) using a lamp light source is used for the activation treatment and hydrogenation treatment of the impurity element. A silicon nitride oxide film (SiNO film) which is obtained by a PCVD method is used for the fourth insulating film 522 containing hydrogen. Here, the thickness of the fourth insulating film 522 containing hydrogen is 50 to 200 nm. Besides, in the case where the semiconductor film is crystallized using a metal element which promotes crystallization, typically nickel, gettering which reduces nickel in the channel formation region can also be performed at the same time as the activation. Note that the fourth insulating film 522 containing hydrogen is a first layer of an interlayer insulating film.

Next, a fifth insulating film 523 which serves as a second layer of the interlayer insulating film is formed by a sputtering method, an LPCVD method, a plasma CVD method, or the like. An insulating film in a single layer or stacked layers such as a silicon oxide film, a silicon nitride film, or a silicon oxynitride film is used as the fifth insulating film 523. Here, the thickness of the fifth insulating film 523 is 300 to 800 nm.

Next, a resist mask is formed over the fifth insulating film 523, using a sixth photomask, and the fourth insulating film 522 and the fifth insulating film 523 are selectively etched, so that a first opening which reaches the first electrode 509 is formed. The resist mask is removed after the etching. A diameter of the first opening may be approximately 1 to 6 µm. In this embodiment, the diameter of the first opening is 2 µm.

A cross-sectional view of the semiconductor device manufactured through the preceding steps corresponds to FIG. 6A.

Next, a silicon film and a germanium film are stacked by a sputtering method, an LPCVD method, a plasma CVD method, or the like. Any one of an amorphous silicon film, a microcrystalline silicon film, and a polysilicon film is used as the silicon film, and an amorphous germanium film or a microcrystalline germanium film is used as the germanium film. A total thickness thereof is 10 to 200 nm. In this embodiment, a 50 nm thick amorphous silicon film and a 50 nm thick amorphous germanium film which are formed by a plasma CVD method are stacked. Then, a resist mask is formed over the amorphous germanium film, using a seventh photomask, and the amorphous silicon film and the amorphous germanium film are selectively etched, so that a silicon layer 524a and an amorphous germanium layer 524b which overlap with the first opening are formed. The resist mask is removed after the etching.

A cross-sectional view of the semiconductor device manufactured through the preceding steps corresponds to FIG. 6B.

Next, a resist mask is formed using an eighth photomask, and the fourth insulating film 522 and the fifth insulating film 523 are selectively etched, so that an opening which reaches the semiconductor layer, an opening which reaches the gate electrode, and a second opening which reaches the first electrode 509 are formed. The resist mask is removed after the etching.

A cross-sectional view of the semiconductor device manufactured through the preceding steps corresponds to FIG. 6C.

Next, an exposed surface of the semiconductor layer and an oxide film on an exposed surface of the first electrode 509 are removed with an etchant containing hydrofluoric acid, and at the same time, the exposed surface of the semiconductor layer and the exposed surface of the first electrode 509 are washed.

Next, a conductive film is formed by a sputtering method to form an upper electrode of a memory element and the source and drain electrodes and the like of the TFTs. This conductive film is formed of an element in a single layer which is selected from titanium (Ti), tungsten (W), nickel (Ni), chromium (Cr), molybdenum (Mo), tantalum (Ta), cobalt (Co), zirconium (Zr), vanadium (V), palladium (Pd), hafnium (Hf), platinum (Pt), iron (Fe), aluminum (Al), and copper (Cu), or an alloy material or a compound material containing the element as its main component, or stacked layers thereof. However, in the case where the conductive films are stacked, at least one layer which is in contact with the germanium layer 524b is formed using a material which reacts with germanium in order to be used for the upper electrode of the memory element. Further, this conductive film is also used for the source and drain electrodes of the TFTs. Therefore, it is preferable to use a material which has relatively low contact resistance with the semiconductor layer to be an active layer of the TFT. For example, a three-layer structure of a titanium film, an aluminum film containing a minute amount of silicon, and a titanium film or a three-layer structure of a titanium film, an aluminum alloy film containing nickel and carbon, and a titanium film is employed. In this embodiment, a three-layer structure of a 100 nm thick titanium film, a 350 nm thick pure aluminum film, and a 100 nm thick titanium film is employed. Further, this embodiment shows the example in which a tungsten film is used as a material of the lower electrode of the memory element and a titanium film is used as a material of the upper electrode. However, the materials are not particularly limited as long as they react with germanium, and the same material may be used for the lower electrode and the upper electrode of the memory element. When the same material is used for the lower electrode and the upper electrode of the memory element, an element in a single layer which is selected from titanium (Ti), tungsten (W), nickel (Ni), chromium (Cr), molybdenum (Mo), tantalum (Ta), cobalt (Co), zirconium (Zr), vanadium (V), palladium (Pd), hafnium (Hf), platinum (Pt), and iron (Fe), an alloy material or a compound material containing any of the elements as its main component, or stacked layers thereof are used.

Next, a resist mask is formed using a ninth photomask, and the conductive film is selectively etched, so that source or drain electrodes 525 to 534, gate lead wirings 535 to 539, a second electrode 540 and a third electrode 541 of the antifuse-type ROM, and a fourth electrode 542 of an antenna portion are formed. The second electrode 540 overlaps with the first opening to serves as the upper electrode of the memory element. In addition, the third electrode 541 overlaps with the second opening to be electrically connected to the first electrode 509. Note that the fourth electrode 542 is electrically connected to TFTs of an antenna portion and power supply portion 603, though the connection is not shown here. The resist mask is removed after the etching.

A cross-sectional view of the semiconductor device manufactured through the preceding steps corresponds to FIG. 6D. In this embodiment, TFTs of a logic circuit portion 601, a TFT and an antifuse-type ROM 600 of a memory portion 602, and TFTs of the antenna portion and power supply portion 603 can be formed over the same substrate with the use of nine photomasks.

Next, a sixth insulating film 543 which covers the TFTs of the logic circuit portion 601, the TFT and the antifuse-type ROM 600 of the memory portion 602, and the TFTs of the antenna portion and power supply portion 603. An insulating film containing silicon oxide or an organic resin film is used as the sixth insulating film 543. The insulating film containing silicon oxide is preferably used to improve reliability of a wireless chip. Alternatively, an organic resin film formed by a coating method is preferably used because the sixth insulating film 543 desirably has a planarized surface in the case where an antenna to be formed later is formed by a screen printing method. The film used as the sixth insulating film 543 may be appropriately selected by practitioners. Moreover, in this embodiment, the example is described in which the antenna to be formed later overlaps with a driver circuit in the power supply portion 603; thus, the sixth insulating film 543 functions as an interlayer insulating film which isolates the driver circuit from the antenna. In the case where the antenna has a circular shape (for example, a loop antenna) or a spiral shape, one of both ends of the antenna is led by a wiring of a lower layer; thus, it is preferable to provide the sixth insulating film 543. However, in the case where a microwave method is employed and the antenna has a linear shape (for example, a dipole antenna), a flat shape (for example, a patch antenna), or the like, the antenna to be formed later can be arranged so as not to overlap with the driver circuit and the memory portion; thus, the sixth insulating film 543 is not necessarily provided.

Next, a resist mask is formed using a tenth photomask, and the sixth insulating film 543 is selectively etched, so that a third opening which reaches the third electrode 541 and a fourth opening which reaches the fourth electrode 542 are formed. The resist mask is removed after the etching.

A cross-sectional view of the semiconductor device manufactured through the preceding steps corresponds to FIG. 7A.

Next, a metal film is formed over the sixth insulating film 543. An element in a single layer which is selected from Ti, Ni, and Au or stacked layers thereof are used as the metal film. Then, a resist mask is formed using an eleventh photomask, and the metal film is selectively etched, so that a lead wiring 544 is formed in a lead wiring portion 604 of the first electrode 509 and a base film 545 of the antenna is formed. Note that the lead wiring 544 and the base film 545 here can be selectively formed by a sputtering method using a metal mask without using the resist mask, as well. When the base film 545 of the antenna is provided, a large contact area with the antenna can be secured. In addition, the lead wiring 544 is not necessarily formed depending on a layout of a circuit design.

A cross-sectional view of the semiconductor device manufactured through the preceding steps corresponds to FIG. 7B.

Next, an antenna 546 is formed over the base film 545. The antenna 546 can be formed by a screen printing method. Alternatively, the antenna 546 can be formed by such a method in which a metal film such as aluminum (Al) or silver (Ag) is formed by a sputtering method and is then patterned using a photomask. If reduction in the number of photomasks is prioritized, the antenna 546 may be formed by a screen printing method. A screen printing method refers to a method in which an ink or a paste, which is provided on a screen plate formed in such a manner that a predetermined pattern is formed by a photosensitive resin on a base made of a metal mesh or a high molecular compound fiber mesh, is transferred to a work which is placed on the opposite side of the screen plate, with the use of a plastic, metal, or rubber blade which is called a squeegee. A screen printing method has a merit that pattern formation in a relatively large area is realized at low cost.

A cross-sectional view of the semiconductor device manufactured through the preceding steps corresponds to FIG. 7C. In this embodiment, the TFTs of the logic circuit portion 601, the TFT and the antifuse-type ROM 600 of the memory portion 602, and the TFTs and the antenna of the antenna portion and power supply portion 603 can be formed over the same substrate with the use of eleven photomasks.

In the case where the lead wiring 544 and the base film 545 of the antenna are selectively formed by a sputtering method using a metal mask, a wireless chip shown in FIG. 7C can be formed using ten photomasks. In the case where a microwave method is employed and an antenna has a linear shape, a flat shape, or the like, the formation of the sixth insulating film 543 and the base film 545 of the antenna can be omitted; thus, the wireless chip can be formed using nine photomasks. Further, if a driver circuit is designed and manufactured using only a p-channel TFT in order to reduce the number of photomasks, the photomasks can be reduced by two, and the wireless chip can be formed using seven photomasks in total.

In addition, although the example in which the resist mask is formed using the photomask is described in this embodiment, there is no particular limitation on the patterning technique. The resist mask may be formed in such a manner that a resist material is selectively formed by a droplet discharging method without using the photomask.

Next, the metal layer 502 and the substrate 501 are removed by separation. Separation occurs inside a metal oxide film, at an interface between the first insulating film 503 and the metal oxide film, or an interface between the metal oxide film and the metal layer 502, so that the wireless chip can be separated from the substrate 501 with relatively less force. When the metal layer 502 and the substrate 501 are removed, a fixed substrate to be bonded on the side where the antenna is provided may be used.

Next, one sheet over which countless wireless chips are formed is divided by a cutter, dicing, or the like so as to be divided into individual wireless chips. In addition, with the use of a method in which each wireless chip is picked up and separated, this dividing step is not needed.

Next, the wireless chip is fixed to a sheet-like base. For the sheet-like base, plastic, paper, a prepreg, a ceramic sheet, or the like can be used. The wireless chip may be fixed so as to be interposed between two sheet-like bases, or the wireless chip may be fixed to one sheet-like base with a bonding layer. For the bonding layer, various curable adhesives such as a photo curable adhesive such as a reactive curable adhesive, a thermosetting adhesive, or an ultraviolet cure adhesive; or an aerobic adhesive can be used. Alternatively, the wireless chip can be arranged in the middle of making paper, thereby being provided inside one piece of paper.

By the wireless chip manufactured through the above-described steps, write-once read-many memory to which data can be written anytime after manufacture of the wireless chip can be realized. For example, after a wireless chip fixed to a flexible sheet-like base is attached to an article with a curved surface, data can be written to an antifuse-type ROM included in the wireless chip.

This embodiment can be freely combined with any of the embodiment modes.

Embodiment 2

In this embodiment, an example in which a process is partly different from that of Embodiment 1 will be shown in FIGS. 8A to 8D and FIGS. 9A to 9C. Note that portions which are common to those in Embodiment 1 are denoted by the same reference numerals, and the same description is omitted for simplification.

First, the same cross-sectional structure as FIG. 6A is obtained according to Embodiment 1. Note that FIG. 8A is the same as FIG. 6A.

Next, a silicon film and a germanium film are formed by a sputtering method, an LPCVD method, a plasma CVD method, or the like, and a metal film is stacked thereover by a sputtering method or a plasma CVD method. Any one of an amorphous silicon film, a microcrystalline silicon film, and a polysilicon film is used as the silicon film. The thickness of the silicon film is 10 to 200 nm. The metal film is formed using a single substance such as titanium (Ti), tungsten (W), nickel (Ni), chromium (Cr), molybdenum (Mo), tantalum (Ta), cobalt (Co), zirconium (Zr), vanadium (V), palladium (Pd), hafnium (Hf), platinum (Pt) or iron (Fe), or an alloy or a compound thereof to have a thickness of 10 to 100 nm. However, the metal film is formed using a material which differs from a material used for forming a first electrode 509 which serves as the lower electrode of the memory element. In this embodiment, stacked layers of an amorphous silicon film and an amorphous germanium film which have a total thickness of 50 nm, and a 100 nm thick titanium nitride film are continuously stacked by a sputtering method without exposure to the air. That is, in this embodiment, the silicon layer and the first electrode are not continuously stacked in a memory portion, whereas the silicon layer, the germanium layer, and a second electrode are continuously stacked. In addition, the metal film may be stacked layers, for example, stacked layers of a titanium film and a titanium nitride film. Although the step of exposing the germanium layer 524*b* is described in Embodiment 1, a germanium layer 524*b* is protected by the continuous formation of the metal film in this embodiment. In particular, in the case where a silicon layer 524*a* and the germanium layer 524*b* have a total thickness of less than or equal to 50 nm, reduction in thickness of the silicon layer 524*a* and the germanium layer 524*b* due to washing with hydrofluoric acid or the like which is performed later can be prevented.

Next, a resist mask is formed over the metal film, using a seventh photomask, and the metal film, the germanium film, and the amorphous silicon film are selectively etched, so that the silicon layer 524*a*, the germanium layer 524*b*, and a second electrode 701 which overlap with a first opening are formed. The resist mask is removed after the etching.

A cross-sectional view of the semiconductor device manufactured through the preceding steps corresponds to FIG. 8B.

Next, a resist mask is formed using an eighth photomask, and a fourth insulating film 522 and a fifth insulating film 523 are selectively etched, so that an opening which reaches a semiconductor layer, an opening which reaches a gate electrode, and a second opening which reaches the first electrode 509 are formed. Then, the resist mask is removed after the etching.

A cross-sectional view of the semiconductor device manufactured through the preceding steps corresponds to FIG. 8C.

Next, an oxide film on an exposed surface of a semiconductor layer and an exposed surface of the first electrode 509 are removed with an etchant containing hydrofluoric acid, and at the same time, the exposed surface of the semiconductor layer and the exposed surface of the first electrode 509 are washed. Note that an upper surface of the germanium layer 524*b* is covered with the second electrode 701, which prevents reduction in film thickness in the washing step here. In this embodiment, the second electrode 701 is a titanium nitride film, which has etching resistance with respect to hydrofluoric acid.

Next, a conductive film is formed by a sputtering method. This conductive film is formed of an element in a single layer which is selected from titanium (Ti), tungsten (W), molybdenum (Mo), aluminum (Al), and copper (Cu), or an alloy material or a compound material containing the element as its main component, or stacked layers thereof. In this embodiment, a three-layer stacked structure of a 100 nm thick titanium film, a 350 nm thick aluminum film containing a minute amount of silicon, and a 100 nm thick titanium film is used.

Next, a resist mask is formed using a ninth photomask and the conductive film is selectively etched, so that source or drain electrodes 525 to 534, gate lead wirings 535 to 539, a third electrode 541 and a fifth electrode 702 of an antifuse-type ROM, and a fourth electrode 542 of an antenna portion are formed. The fifth electrode 702 overlaps with the second electrode 701 to reduce electric resistance of a wiring. In addition, the third electrode 541 overlaps with the second opening to be electrically connected to the first electrode 509. Note that the fourth electrode 542 is electrically connected to TFTs of an antenna portion and power supply portion, though the connection is not shown here. The resist mask is removed after the etching.

A cross-sectional view of the semiconductor device manufactured through the preceding steps corresponds to FIG. 8D. Also in this embodiment, TFTs of a logic circuit portion 601, a TFT and an antifuse-type ROM 600 of a memory portion 602, and TFTs of an antenna portion and power supply portion 603 can be formed over the same substrate with the use of nine photomasks.

Next, a sixth insulating film 543 which covers the TFTs of the logic circuit portion 601, the TFT and the antifuse-type ROM 600 of the memory portion 602, and the TFTs of the antenna portion and power supply portion 603 is formed. An insulating film containing silicon oxide or an organic resin film is used for the sixth insulating film 543. The insulating film containing silicon oxide is preferably used to improve reliability of a wireless chip. Alternatively, an organic resin film formed by a coating method is preferably used because the sixth insulating film 543 desirably has a planarized surface in the case where an antenna to be formed later is formed by a screen printing method. The film used as the sixth insulating film 543 may be appropriately selected by practitioners.

Next, a resist mask is formed using a tenth photomask, and the sixth insulating film 543 is selectively etched, so that a fourth opening which reaches the fourth electrode 542 is formed. The resist mask is removed after the etching.

A cross-sectional view of the semiconductor device manufactured through the preceding steps corresponds to FIG. 9A.

Next, a base film 545 of the antenna is formed over the sixth insulating film 543 by a sputtering method using a metal mask or a droplet discharging method. The base film 545 of the antenna is formed of an element in a single layer which is selected from Ti, Ni, and Au, or stacked layers thereof. Note that the base film 545 here may be formed in such a manner that a resist mask is formed using a photomask and a metal film is selectively etched.

A cross-sectional view of the semiconductor device manufactured through the preceding steps corresponds to FIG. 9B.

Next, an antenna 546 is formed over the base film 545. The antenna 546 can be formed by a screen printing method. Alternatively, the antenna 546 can be formed by such a manner in which a metal film is formed by a sputtering method and then is patterned using a photomask. If reduction in the number of photomasks is prioritized, the antenna 546 may be formed by a screen printing method.

A cross-sectional view of the semiconductor device manufactured through the preceding steps corresponds to FIG. 9C. In this embodiment, the TFTs of the logic circuit portion 601, the TFT and the antifuse-type ROM 600 of the memory portion 602, and the TFTs and the antenna of the antenna portion and power supply portion 603 can be formed over the same substrate with the use of ten photomasks.

In addition, if a driver circuit is designed and manufactured using only a p-channel TFT in order to reduce the number of photomasks, the photomasks can be reduced by two, and the wireless chip can be formed using eight photomasks in total.

Moreover, the subsequent steps may be performed in accordance with Embodiment 1, so that the wireless chip can be completed.

In addition, although the example in which the resist mask is formed using the photomask is described in this embodiment, there is no particular limitation on the patterning technique. The resist mask may be formed in such a manner that a resist material is selectively formed by a droplet discharging method without using the photomask.

This embodiment can be freely combined with any of the embodiment modes and Embodiment 1.

Embodiment 3

Figure 10:
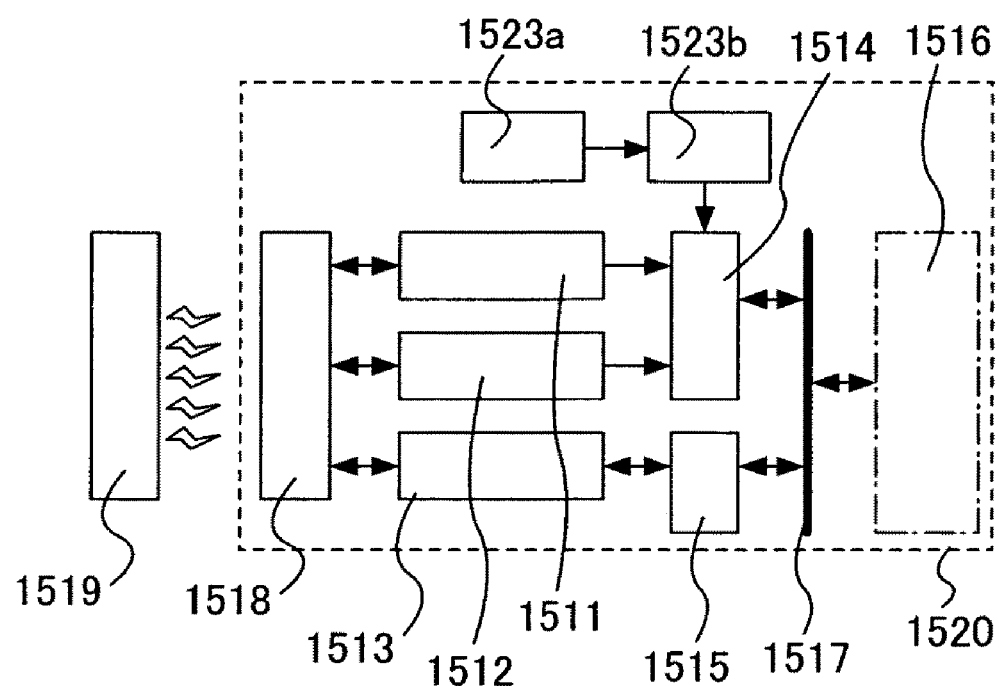
FIG. 10 is a block diagram showing a wireless chip.

A structure of a semiconductor device of this embodiment will be described with reference to FIG. 10. As shown in FIG. 10, a semiconductor device 1520 of the present invention has a function of performing non-contact data communication. The semiconductor device 1520 includes a power supply circuit 1511, a clock generation circuit 1512, a data demodulation/modulation circuit 1513, a control circuit 1514 which controls other circuits, an interface circuit 1515, a memory circuit 1516, a data bus 1517, an antenna 1518, a sensor 1523a, and a sensor circuit 1523b. In FIG. 10, a driver circuit refers to the power supply circuit 1511, the clock generation circuit 1512, the data demodulation/modulation circuit 1513, the control circuit 1514 which controls other circuits, and the interface circuit 1515.

The power supply circuit 1511 generates various power supply voltage to be supplied to each circuit in the semiconductor device 1520, based on an AC signal inputted from the antenna 1518. The clock generation circuit 1512 generates various clock signals to be supplied to each circuit in the semiconductor device 1520, based on the AC signal inputted from the antenna 1518. The data demodulation/modulation circuit 1513 has a function of demodulating/modulating data communicated with a reader/writer 1519. The control circuit 1514 has a function of controlling the memory circuit 1516. The antenna 1518 has a function of transmitting and receiving radio waves. The reader/writer 1519 performs communication with the semiconductor device, control of the communication, and control of processing of the communicated data. Note that the structure of the semiconductor device is not limited to the above-described structure. For example, the semiconductor device may have a structure to which other components such as a limiter circuit of power supply voltage or hardware only for processing codes are added.

The memory circuit 1516 includes such a memory portion as described in Embodiment Mode 1, that is, a plurality of memory elements each including stacked layers of a germanium film and a silicon film which is to be a silicide by reaction with a conductive layer which is in contact with the silicon film by external electrical action, which are interposed between a pair of conductive layers. Note that the memory circuit 1516 may include only the memory element in which the stacked layers of a silicon film and a germanium film are interposed between the pair of conductive layers, or include a memory circuit with any other structure. The memory circuit with any other structure corresponds to, for example, one or a plurality of memories selected from a DRAM, an SRAM, an FeRAM, a mask ROM, a PROM, an EPROM, an EEPROM, and a flash memory.

The sensor 1523a is formed of semiconductor elements such as a resistive coupling element, a capacitive coupling element, an inductive coupling element, a photovoltaic element, a photoelectric conversion element, a thermo-electromotive force element, a transistor, a thermistor, or a diode. The sensor circuit 1523b detects changes in impedance, reactance, inductance, voltage, or current, and performs analog/digital conversion (A/D conversion) to output a signal to the control circuit 1514.

This embodiment can be freely combined with any of the embodiment modes, Embodiment 1, and Embodiment 2.

Embodiment 4

Figure 11A:
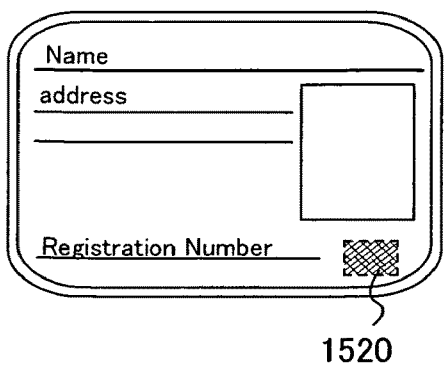
FIGS. 11A to 11F are views each showing an example of an electronic device.
Figure 11B:
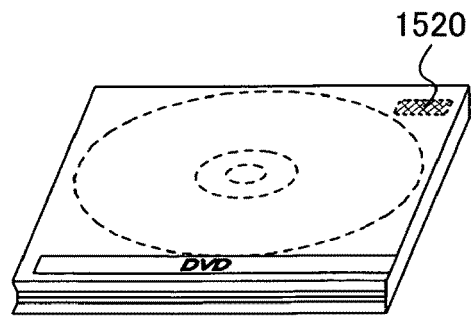
Figure 11C:
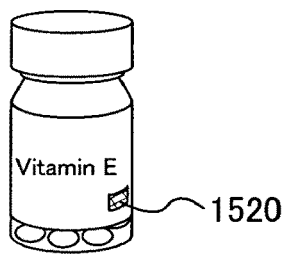
Figure 11D:
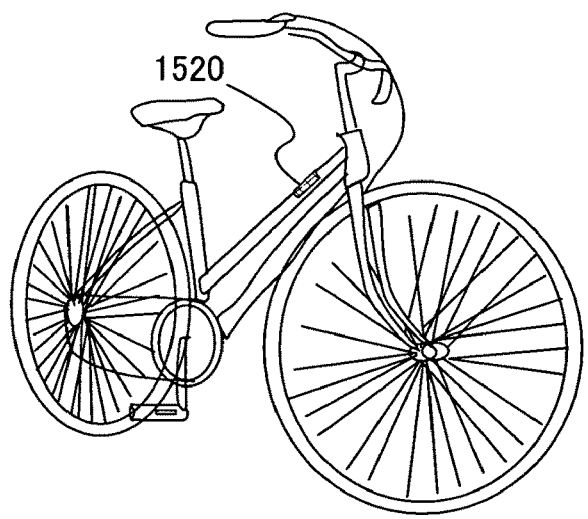
Figure 11E:
Figure 11F:
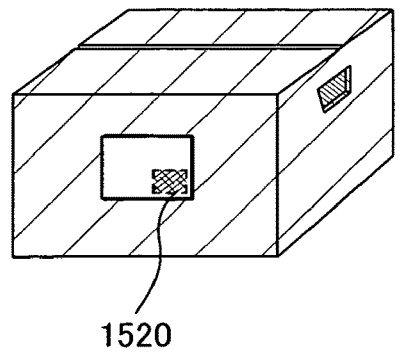

A semiconductor device which functions as a wireless chip can be formed according to the present invention. The wireless chip is applicable in a wide range. For example, the wireless chip can be applied to bills, coins, securities, bearer bonds, identification certificates (driver's licenses, certificates of residence, or the like; see FIG. 11A), containers for package (wrapping paper, a bottle, or the like; see FIG. 11C), recording media (DVD software, video tapes, or the like; see FIG. 11B), vehicles (bicycles or the like; see FIG. 11D), personal belongings (bags, glasses, or the like), foods, plants, animals, clothes, commodities, tags for packages or articles such as electronic devices (see FIGS. 11E and 11F), and the like. The electronic devices include a liquid crystal display device, an EL display device, a television device (also simply referred to as a TV, a TV receiver, or a television receiver), a cellular phone, and the like.

The semiconductor device 1520 of the present invention is fixed to a product by being mounted on a printed board, attached to a surface of the product, or embedded inside the product. For example, in the case of a book, the semiconductor device 1520 is fixed to the book by being embedded inside a paper, and in the case where the product is a package made of an organic resin, the semiconductor device 1520 is fixed to the package by being embedded inside the organic resin. Since the semiconductor device 1520 of the present invention can be compact, thin, and lightweight, the design quality of the product itself is not degraded even after the device is fixed to the product. When the semiconductor device 1520 is provided to bills, coins, securities, bearer bonds, identification certificates, or the like, a certification function can be provided and the forgery can be prevented with the utilization of the certification function. Moreover, when the semiconductor device of the present invention is provided in containers for package, recording media, personal belongings, foods, clothes, commodities, electronic devices, or the like, systems such as an inspection system can become more efficient.

Figure 12:
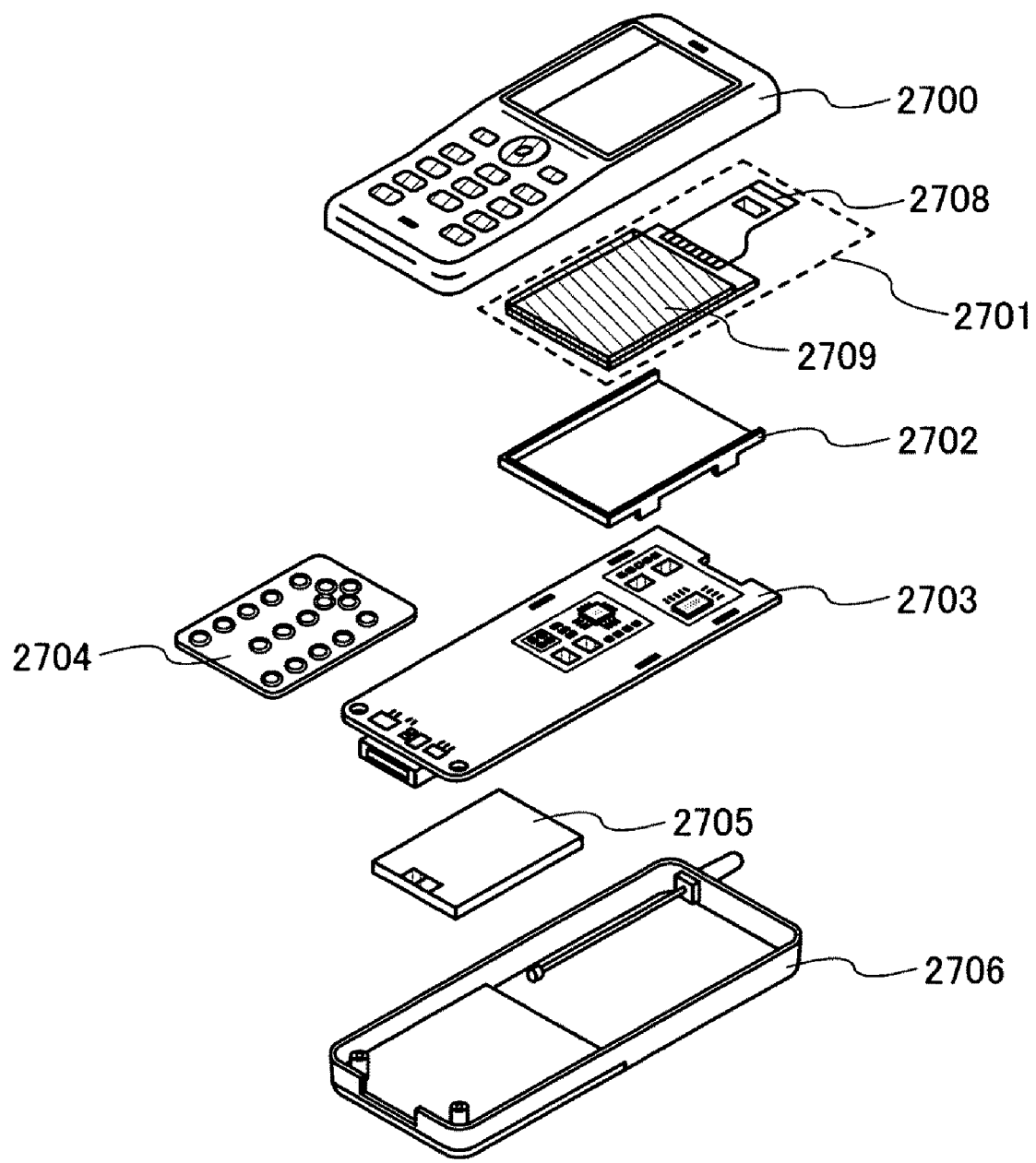
FIG. 12 is a view showing an example of an electronic device.
Figure 13:
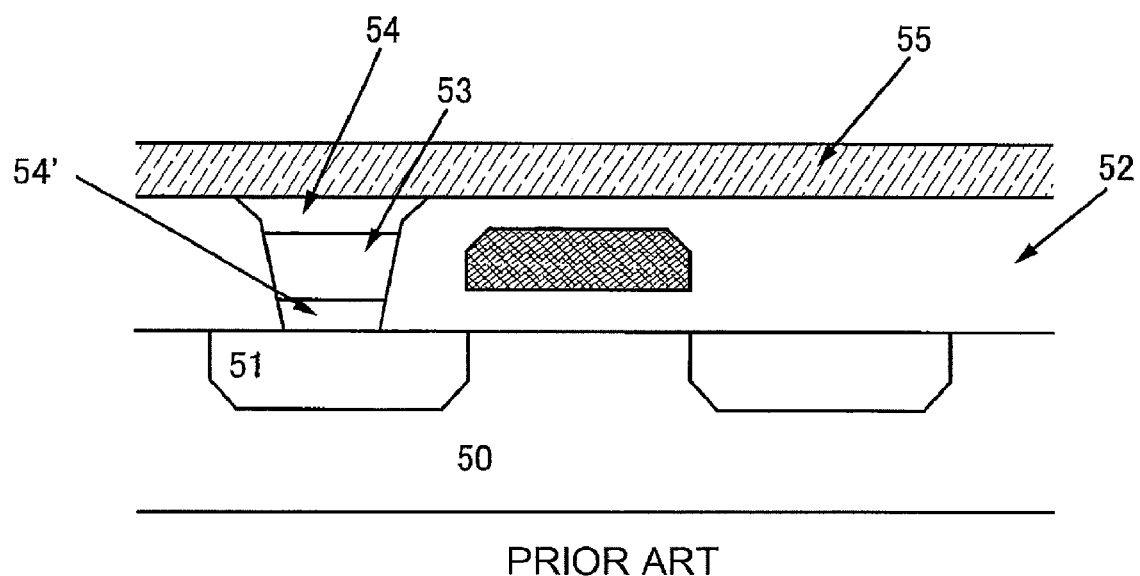
FIG. 13 is a view showing a conventional example.

Next, one mode of an electronic device on which the semiconductor device of the present invention is mounted is described with reference to the drawing. An electronic device shown here as an example is a cellular phone including chassis 2700 and 2706, a panel 2701, a housing 2702, a printed wiring board 2703, operation buttons 2704, and a battery 2705 (see FIG. 12). The panel 2701 is detachably incorporated into the housing 2702, and the housing 2702 is fitted into the printed wiring board 2703. The shape and size of the housing 2702 are appropriately modified in accordance with an electronic device into which the panel 2701 is incorporated. The printed wiring board 2703 has a plurality of packaged semiconductor devices mounted thereon. The semiconductor device of the present invention can be used as one of the packaged semiconductor devices. The plurality of semiconductor devices mounted on the printed wiring board 2703 have any function of a controller, a central processing unit (CPU), a memory, a power supply circuit, an audio processing circuit, a transmitting and receiving circuit, and the like.

The panel 2701 is electrically connected to the printed wiring board 2703 through a connection film 2708. The panel 2701, the housing 2702, and the printed wiring board 2703 are placed inside the chassis 2700 and 2706 together with the operation buttons 2704 and the battery 2705. A pixel region 2709 included in the panel 2701 is placed so as to be viewable from an opening window provided in the chassis 2700.

As described above, the semiconductor device of the present invention has characteristics of being small in size, thin, and lightweight. These characteristics allow efficient usage of the limited space in the chassis 2700 and 2706 of the electronic device.

The semiconductor device of the present invention includes a memory element having a structure in which stacked layers of a silicon film and a germanium film, which cause thermal reaction by external electrical action, are interposed between a pair of conductive layers; thus, an electronic device using an inexpensive semiconductor device can be provided. In addition, high integration is easily realized with the semiconductor device of the present invention; thus, an electronic device using a semiconductor device including a high-capacity memory circuit can be provided.

Moreover, a memory device included in the semiconductor device of the present invention, which writes data by external electrical action, has characteristics of being nonvolatile and capable of adding data. According to the above-described characteristics, forgery by rewriting can be prevented, and new data can be additionally written. Accordingly, an electronic device which uses a highly functional and highly value-added semiconductor device can be provided.

Note that the shapes of the chassis 2700 and 2706 are examples of an exterior shape of the cellular phone, and the electronic device of this embodiment can be changed into various modes in accordance with functions or applications thereof.

This embodiment can be freely combined with any of the embodiment modes, Embodiment 1, Embodiment 2, and Embodiment 3.

Manufacture using a large area glass substrate makes it possible to provide a large number of wireless chips at a time and make unit cost of the wireless chip inexpensive. In addition, an antenna can be formed over the same substrate as the wireless chip; thus, a mounting step can be eliminated.

This application is based on Japanese Patent Application serial no. 2007-024434 filed with Japan Patent Office on Feb. 2, 2007, the entire contents of which are hereby incorporated by reference.

What is claimed is:

1. A semiconductor device including a driver circuit having a thin film transistor and a memory element, the semiconductor device comprising:
    a first electrode;
    an insulating layer over the first electrode, the insulating layer having an opening;
    a silicon film over the insulating layer;
    a germanium film over the silicon film; and
    a second electrode over the germanium film,
    wherein a gate electrode of the thin film transistor is formed of the same material as one of electrodes of the memory element,
    wherein a source or drain electrode of the thin film transistor is formed of the same material as the other electrode of the memory element, and
    wherein the memory element comprising the first electrode, the silicon film, the germanium film and the second electrode is formed in the opening.

2. The semiconductor device according to claim 1, wherein the first electrode and the second electrode are formed of different materials.

3. The semiconductor device according to claim 2, wherein a work function of a material contained in the first electrode is higher than a work function of a material contained in the second electrode.

4. The semiconductor device according to claim 1, wherein the substrate is a glass substrate, a plastic film or paper.

5. The semiconductor device according to claim 1, wherein the first electrode contains an element selected from the group consisting of titanium (Ti), tungsten (W), nickel (Ni), chromium (Cr), molybdenum (Mo), tantalum (Ta), cobalt (Co), zirconium (Zr), vanadium (V), palladium (Pd), hafnium (Hf), platinum (Pt), and iron (Fe).

6. The semiconductor device according to claim 1, wherein the silicon film is an amorphous silicon film, a microcrystalline silicon film or a polycrystalline silicon film.

7. The semiconductor device according to claim 1, wherein the germanium film is an amorphous germanium film or a germanium film containing silicon.

8. A semiconductor device including a driver circuit having a thin film transistor, a memory element and an antenna, the semiconductor device comprising:
    a first electrode;
    an insulating layer over the first electrode, the insulating layer having an opening;
    a silicon film over the insulating layer;
    a germanium film over the silicon film; and
    a second electrode over the germanium film,
    wherein a gate electrode of the thin film transistor is formed of the same material as one of electrodes of the memory element,
    wherein a connection electrode is formed below the antenna, and the antenna is electrically connected to the connection electrode,
    wherein the connection electrode is electrically connected to the thin film transistor,
    wherein the connection electrode is formed of the same material as a source or drain electrode of the thin film transistor and the same material as the other electrode of the memory element, and
    wherein the memory element comprising the first electrode, the silicon film, the germanium film and the second electrode is formed in the opening.

9. The semiconductor device according to claim 8, wherein the first electrode and the second electrode are formed of different materials.

10. The semiconductor device according to claim 9, wherein a work function of a material contained in the first electrode is higher than a work function of a material contained in the second electrode.

11. The semiconductor device according to claim 9, wherein the substrate is a glass substrate, a plastic film or paper.

12. The semiconductor device according to claim 9, wherein the first electrode contains an element selected from the group consisting of titanium (Ti), tungsten (W), nickel (Ni), chromium (Cr), molybdenum (Mo), tantalum (Ta), cobalt (Co), zirconium (Zr), vanadium (V), palladium (Pd), hafnium (Hf), platinum (Pt), and iron (Fe).

13. The semiconductor device according to claim 9, wherein the silicon film is an amorphous silicon film, a microcrystalline silicon film or a polycrystalline silicon film.

14. The semiconductor device according to claim 9, wherein the germanium film is an amorphous germanium film or a germanium film containing silicon.

15. The semiconductor device according to claim 8, wherein the first electrode and the second electrode are formed of same materials.

* * * * *

UNITED STATES PATENT AND TRADEMARK OFFICE
CERTIFICATE OF CORRECTION

PATENT NO.       : 7,994,607 B2                             Page 1 of 1
APPLICATION NO.  : 12/010795
DATED            : August 9, 2011
INVENTOR(S)      : Hajime Tokunaga et al.

It is certified that error appears in the above-identified patent and that said Letters Patent is hereby corrected as shown below:

At column 4, line 12, "C.°" should be --°C--;

At column 4, line 13, "C.°" should be --°C--;

At column 9, line 17, "C.°" should be --°C--;

At column 9, line 33, "C.°" should be --°C--;

At column 11, line 11, "value×a" should be --value × a--.

Signed and Sealed this
Fifteenth Day of November, 2011

David J. Kappos
*Director of the United States Patent and Trademark Office*